United States Patent
Lee

(10) Patent No.: US 10,998,738 B2
(45) Date of Patent: May 4, 2021

(54) FUSIBLE SWITCH, BATTERY CONTROL APPARATUS INCLUDING SAME, AND BATTERY CONTROL METHOD

(71) Applicant: Seung Gyu Lee, Changwon-si (KR)

(72) Inventor: Seung Gyu Lee, Changwon-si (KR)

(*) Notice: Subject to any disclaimer, the term of this patent is extended or adjusted under 35 U.S.C. 154(b) by 356 days.

(21) Appl. No.: 15/560,982

(22) PCT Filed: Mar. 16, 2016

(86) PCT No.: PCT/KR2016/002639
§ 371 (c)(1),
(2) Date: Sep. 22, 2017

(87) PCT Pub. No.: WO2016/153215
PCT Pub. Date: Sep. 29, 2016

(65) Prior Publication Data
US 2018/0175640 A1    Jun. 21, 2018

(30) Foreign Application Priority Data

Mar. 24, 2015    (KR) .................. 10-2015-0040842

(51) Int. Cl.
*H02J 7/00*  (2006.01)
*G01R 31/382*  (2019.01)
(Continued)

(52) U.S. Cl.
CPC .......... *H02J 7/0024* (2013.01); *G01R 31/382* (2019.01); *H01H 37/76* (2013.01);
(Continued)

(58) Field of Classification Search
USPC ....................................... 320/134
See application file for complete search history.

(56) References Cited

U.S. PATENT DOCUMENTS 3,436,697 A    4/1969 Snyder
3,465,270 A    9/1969 Schattler
(Continued)

FOREIGN PATENT DOCUMENTS

CN    101093763    12/2007
EP    0 665 568 A1    8/1995
(Continued)

OTHER PUBLICATIONS

Machine translation of CN101093763A (Year: 2007).*

*Primary Examiner* — Samuel Berhanu
(74) *Attorney, Agent, or Firm* — Maschoff Brennan

(57) ABSTRACT

A battery control apparatus for a battery according to the present invention excludes a faulty battery cell from the connection between battery cells and at the same time automatically connects a replacement battery cell to the battery cells when a fault occurs in some of the battery cells, thereby allowing the output voltage of the battery to be kept constant in spite of the faulty battery cell. Further, in a state where a plurality of battery modules are connected in parallel, the battery control apparatus disconnects a battery module including a faulty battery cell during the replacement of the faulty battery cell, thereby preventing the output voltage of the battery from being discontinuous. In addition, a switch used in the battery control apparatus for a battery is a fusible switch including two separate fixed electrodes and one movable electrode.

29 Claims, 33 Drawing Sheets

(51) Int. Cl.
    *H01M 10/42*     (2006.01)
    *H01H 61/02*     (2006.01)
    *H01H 37/76*     (2006.01)
    *H01M 50/572*    (2021.01)
    *H01H 85/00*     (2006.01)
    *H01H 85/08*     (2006.01)
    *H01H 85/143*    (2006.01)
    *H01H 85/38*     (2006.01)

(52) U.S. Cl.
    CPC ........ *H01H 61/02* (2013.01); *H01H 85/0047* (2013.01); *H01H 85/08* (2013.01); *H01H 85/143* (2013.01); *H01H 85/38* (2013.01); *H01M 10/42* (2013.01); *H01M 50/572* (2021.01); *H02J 7/0016* (2013.01); *H02J 7/0031* (2013.01); *H02J 7/0047* (2013.01); *H01H 2037/762* (2013.01); *H01H 2037/768* (2013.01); *Y02T 10/70* (2013.01)

(56) References Cited

U.S. PATENT DOCUMENTS

| | | | |
|---|---|---|---|
| 5,025,119 A | 6/1991 | Rogers et al. | |
| 5,898,356 A | 4/1999 | Gascoyne et al. | |
| 6,229,282 B1 | 5/2001 | Stadnick et al. | |
| 6,452,475 B1* | 9/2002 | Kawazu | H01H 85/463 29/623 |
| 10,109,439 B2* | 10/2018 | Komori | H01H 37/761 |
| 2005/0001710 A1* | 1/2005 | Mukai | H01H 85/143 337/297 |
| 2007/0289948 A1 | 12/2007 | Shinohara | |
| 2008/0116851 A1* | 5/2008 | Mori | H01M 10/443 320/134 |
| 2011/0012704 A1* | 1/2011 | Kimura | H01H 37/761 337/168 |
| 2012/0181988 A1* | 7/2012 | Uchibori | H01M 2/348 320/134 |
| 2013/0049679 A1* | 2/2013 | Mukai | H01M 10/48 320/107 |
| 2013/0106178 A1 | 5/2013 | Girard et al. | |
| 2014/0008985 A1 | 1/2014 | Subbotin et al. | |
| 2014/0177121 A1* | 6/2014 | Ueno | H02H 5/04 361/104 |
| 2014/0198424 A1* | 7/2014 | Hugo | G01K 13/00 361/104 |
| 2016/0344013 A1* | 11/2016 | Lee | H01M 50/579 |

FOREIGN PATENT DOCUMENTS

| | | |
|---|---|---|
| EP | 2 717 415 A1 | 4/2014 |
| FR | 2884643 A1 | 10/2006 |
| GB | 2355340 A | 4/2001 |
| JP | 2004-185990 A | 7/2004 |
| JP | 2004185990 A | 7/2004 |
| JP | 2010-003665 A | 1/2010 |
| JP | 2012-150086 A | 8/2012 |
| KR | 10-2007-0091814 A | 9/2007 |
| KR | 1020070091814 A | 9/2007 |
| KR | 10-2013-0040435 A | 4/2013 |
| KR | 10-2014-0017043 A | 2/2014 |
| KR | 10-2014-0091109 A | 7/2014 |
| KR | 10-2014-0115666 A | 10/2014 |
| KR | 10-2011-0020156 A | 3/2016 |
| WO | 2014/117711 A1 | 8/2014 |

* cited by examiner (a)

(b)

(a)          (b)

(a)

(b)

(a)

(b)

(a)

(b)

(a)

(b)

(a)

(b)

(a)

(b)

(a)

(b)

(a)  (b)

(a)  (b)

(a)  (b)

(a)

(b)

(a)

(b)

(a)

(b)

(c)

(a)

(b)

(c)

(a)

(b)

(c)

(d)

(a)

(b)

(a)

(b)

(c)

(a)

(b)

FUSIBLE SWITCH, BATTERY CONTROL APPARATUS INCLUDING SAME, AND BATTERY CONTROL METHOD

TECHNICAL FIELD

The present disclosure relates to a fusible switch, a battery control apparatus including the same, and a battery control method, and more particularly, to a battery control apparatus that automatically replaces a faulty cell with a replacement battery cell when a part of the battery cell is faulty, a control method thereof, and a fusible switch used therein.

BACKGROUND ART

Recently, with technological development of electric vehicles and energy storage systems (ESS) and the like, research on high-voltage, large-capacity battery packs formed by connecting multiple battery cells has been actively conducted.

Currently, various methods, such as using a battery management system (BMS) and the like, are attempted to secure battery safety. However, due to the electrochemical nonlinearity and unstable characteristics of the battery, fundamental safety techniques for preventing battery cell damage and fault have not been developed.

In particular, a battery pack having multiple battery cells connected to each other has a critical limitation in that, when any one unit cell fails, the entire battery pack, which is expensive, must be replaced.

In order not to replace the entire battery pack, technology for detecting a faulty cell and excluding connection of the faulty cell has been developed.

Such technology is disclosed in, for example, Patent Document 1 (Korean Patent Application Publication No. 10-2013-0040435A, Publication date: Apr. 24, 2014) and Patent Document 2 (Korean Patent Application Publication No. 10-2014-0091109A, Publication date: Jul. 21, 2014). Patent Document 1 and Patent Document 2 disclose "In a battery pack having a plurality of battery cells connected in series, when a battery cell fails, the faulty battery cell is bypassed in the battery formed by series connection, thereby automatically restoring the faulty battery pack."

However, this technology fails to compensate for a voltage drop loss of the battery pack caused by bypassing the faulty cell in the battery.

Further, when the bypassing method mentioned above is applied to a battery pack with serial-parallel connection, a voltage difference is produced between modules connected in parallel.

In addition, the technology of the patent documents above has a structural problem in that the charge/discharge current of the battery load is cut off due to the discontinuity section produced when the faulty cell is bypassed with a relay.

Therefore, there is a need for a technology capable of solving the problems of voltage drop of a battery pack and discontinuity of charge/discharge current caused by the aforementioned bypassing of the battery cell.

In addition, in Patent Documents 1 and 2, multiple switches including diodes are used. Since a large amount of current passes through these switches, on resistance causes a problem.

When a large amount of current flows through the switches, high power consumption and heat generation, which are serious obstacles to realizing high output and high density of the switches, are caused due to the on resistance of the switches.

Generally, switches are broadly divided into semiconductor-based switches and mechanical contact-based switches. Semiconductor-based switches such as transistors have excellent impact resistance and high operating frequency compared to mechanical switches such as relays and contactors.

On the other hand, the mechanical switches such as relays and contactors have lower impact resistance than that of semiconductor switches, but have very low contact resistance.

However, mechanical contact switches also have contact resistance according to mechanical contact since the current flows between two conductors through mechanical contact. As a result, when a large amount of current flows, the contact resistance causes excessive power consumption and generates heat in the switches.

Therefore, in order to reduce the contact resistance, a contact area between conductors should be increased, and a material having a low resistivity and a high conductivity should be used for the contact point. The contact resistance depends on the contact pressure between the two conductors. The higher the contact pressure, the lower the contact resistance.

However, if the contact surface is expanded to satisfy the required level of contact resistance, the volume of the contact conductor will increase in proportion thereto, and using a conductor having a high conductivity such as silver or platinum will increase cost. In addition, a strong physical force is required to maintain the mechanical contact state against external impact/vibration and to increase the contact pressure to reduce the contact resistance, which increases the volume and weight of the switch.

Therefore, the conventional switch technology has a limit in implementing a compact/lightweight switch that exhibits high impact resistance and low contact resistance when a large amount of current flows therethrough.

In order to overcome this limit, inventions related to a soldering-based fusible switch (which is a term employed in this specification, but may also be referred to as a "fusion switch") for bonding two contacts by melting conductive bonding materials have been made. These inventions can be broadly divided into the following two methods.

In the first method, spaced electrodes are directly moved to contact each other, thereby pressing and contacting a soldering material between the electrodes. That is, this method can be called a press-contact method. The switch of Patent Document 3 (U.S. Pat. No. 5,025,119A, Date of Patent Jun. 18, 1991) may be an example of the press-contact method. The switch of Patent Document 3 has a structure in which Joule heat (heat generated in the conductor due to current flow) is generated by the contact resistance generated in the contact process of two electrodes and the on-current, and the conductive bonding material is fused by the Joule heat.

The press-contact method can reduce the on resistance by press and contact of the two electrodes, but is not suitable for use in a switch having a large current capacity since it causes the electrode side terminal to move.

That is, the press-contacting electrodes are limited to thin conductors so as to have bendability at a predetermined length in order to have mobility. Therefore, a thick conductor having very low resistance cannot be used. Accordingly, the press-contact method has a structural limit in minimizing on resistance.

In addition, in Patent Document 3, Joule heat is generated by contact resistance and on-current generated when the switch is turned on (closed), and the conductive bonding material is fused and bonded by the Joule heat.

Further, in Patent Document 3, the degree of fusion bonding between the two electrodes is determined according to the amount of Joule heat generated by the on-current and the contact resistance. Therefore, if the on-current or contact resistance is not large enough to generate sufficient Joule heat, the on resistance increases due to local fusion bonding of the contacts.

Further, the switch of Patent Document 3 has an irreversible structure in which state transition between on-off contacts occurs only in one direction, and is thus limited to a one-time close switch. That is, the state can be changed from the off state to the on state, but cannot be changed from the on state to the off state. In other words, the return operation after a switching operation is impossible.

Due to these problems, a fusible switch using the press-contact method, which causes movement of an electrode side terminal, has not been put to practical use, and the following second method has been proposed.

The second method is to melt a soldering material by heat, then fill a gap between two spaced stationary electrodes with the melted soldering material and then perform a solidification process. A fusible switch using this method can be called a fusible switch of a gap-filling method, and is disclosed in, for example, Patent Document 4 (U.S. Pat. No. 5,898,356A, Publication Date: Apr. 28, 1999), and Patent Document 5 (GB2355340A, Publication Date: Apr. 18, 2001).

However, since the resistivity of the soldering material is generally greater than the resistivity of the electrode, the withstand voltage (or insulation resistance) between the electrodes in the above-mentioned gap-filling method increases in proportion to the distance between the electrodes, and the amount of the conductive bonding material filling the air gap also increases in proportion to the distance, thereby increasing the on resistance of the switch.

Therefore, the fusible switch according to the gap-filling method is not suitable for use in an environment requiring a large current at a high voltage.

The switches of Patent Documents 4 and 5 have an irreversible structure in which state transition between on-off contacts occurs only in one direction, and are thus limited to a one-time close switch. That is, it is possible to switch from the off state to the on state, but it is not possible to switch back from the on state to the off state.

In addition, the switches of Patent Documents 4 and 5 are complicated in structure, and a large amount of soldering material is required in the switching operation.

For the conventional fusible switch, the on-current flowing through the switch is usually used. In this case, it is difficult to perform an independent switch operation irrespective of the on-current of the switch.

DISCLOSURE

Technical Problem

Therefore, the present invention has been made in view of the above problems, and it is one object of the present invention to provide a control apparatus for a battery including a plurality of battery cells connected to each other, which is capable of automatically excluding faulty battery cells from the connection and addressing voltage drop and discontinuity of charge/discharge current.

It is another object of the present invention to provide a compact/lightweight fusible switch structure capable of minimizing the on resistance of a switch when a large amount of current flows as the aforementioned apparatus requires a switch allowing a large amount of current to flow therethrough.

It is yet another object of the present invention to provide a fusible switch capable of performing a reversible operation (return operation after a switch operation) and performing on/off control independent of the on-current of the switch.

It is yet another object of the present invention to provide a fusible switch that can be used as an open switch, not only as a close switch, while the conventional fusible switch can be used only as a close switch.

Technical Solution

In accordance with one aspect of the present invention, provided is a control apparatus for a battery having a plurality of basic battery cells and one or more replacement battery cells connected in series, the control apparatus including: a first type switch connected in series to each of the basic battery cells; a second type switch connected in parallel to a path connected in series with the first type switch; a second type switch connected in series to each of the replacement battery cells; a first type switch connected in parallel to a path connected in series with the second type switch; a sensing unit for measuring a condition of each of the battery cells; and a controller for controlling operations of the switches, wherein the first type switches are switches capable of transitioning from an initial closed state to an open state, and the second type switches are switches capable of transitioning from an initial open state to a closed state, wherein, when a faulty battery cell is sensed among the basic battery cells according to input of the sensing unit, the controller operates the first type switch and the second type switch connected to the faulty battery cell to exclude connection of the faulty battery cell from an electricity flow line, and controls the first type switch and the second type switch connected to one of the replacement battery cells to operate such that the replacement battery cell is included in the electricity flow line.

In accordance with another aspect of the present invention, provided is a control apparatus for a battery having battery modules connected in parallel, each of the battery modules having a plurality of basic battery cells and one or more replacement battery cells connected in series, the control apparatus including: a first type switch connected in series to each of the basic battery cells; a second type switch connected in parallel to a path connected in series with the first type switch; a second type switch connected in series to each of the replacement battery cells; a first type switch connected in parallel to a path connected in series with the second type switch; a module switch connected in series to each of the battery modules; a sensing unit for measuring a condition of each of the battery cells; and a controller for controlling operations of the switches, wherein the first type switches are switches capable of transitioning from an initial closed state to an open state, and the second type switches are switches capable of transitioning from an initial open state to a closed state, wherein, when a faulty battery cell is sensed among the basic battery cells according to input of the sensing unit, the controller operates the first type switch and the second type switch connected to the faulty battery cell to exclude connection of the faulty battery cell from an electricity flow line, controls the first type switch and the second type switch connected to a replacement battery cell selected in a battery module having the faulty battery cell such that the selected replacement battery cell is included in the electricity flow line, and controls the module switch of the corresponding battery module to be open before switch control for the replacement starts in the corresponding battery module and to be closed after the switch control for the replacement is terminated.

In accordance with another aspect of the present invention, provided is a control method for a battery control apparatus for a battery module having a plurality of basic battery cells and one or more replacement battery cells connected in series, the control method including: a controller of the battery control apparatus sensing a faulty battery cell among the basic battery cells according to input of a sensing unit; the controller of the battery control apparatus operating a first type switch and a second type switch connected to the faulty battery cell and excluding connection of the faulty battery cell from an electricity flow line; and the controller of the battery control apparatus operating a first type switch and a second type switch connected to a replacement battery cell and including the replacement battery cell in the electricity flow line, wherein the battery control apparatus includes: a first type switch connected in series to each of the basic battery cells; a second type switch connected in parallel to a path connected in series with the first type switch; a second type switch connected in series to each of the replacement battery cells; a first type switch connected in parallel to a path connected in series with the second type switch; the sensing unit for measuring a condition of each of the battery cells; and the controller for controlling operations of the switches, wherein the first type switches are switches capable of transitioning from an initial closed state to an open state, and the second type switches are switches capable of transitioning from an initial open state to a closed state.

In accordance with another aspect of the present invention, provided is a control method for a battery control apparatus for a battery having battery modules connected in parallel, each of the battery modules having a plurality of basic battery cells and one or more replacement battery cells connected in series, the control method including: a controller of the battery control apparatus sensing a faulty battery cell among the basic battery cells according to input of a sensing unit; the controller of the battery control apparatus opening a module switch of a battery module including the faulty battery cell; the controller of the battery control apparatus operating the first type switch and the second type switch connected to the faulty battery cell and excluding connection of the faulty basic battery cell from an electricity flow line; the controller of the battery control apparatus operating the first type switch and the second type switch connected to a replacement battery and including the replacement battery in the electricity flow line; and the controller of the battery control apparatus closing the module switch of the battery module including the faulty battery cell, wherein the battery control apparatus includes: a first type switch connected in series to each of the basic battery cells; a second type switch connected in parallel to a path connected in series with the first type switch; a second type switch connected in series to each of the replacement battery cells; a first type switch connected in parallel to a path connected in series with the second type switch; a module switch connected in series to each of the battery modules; a sensing unit for measuring a condition of each of the battery cells; and a controller for controlling operations of the switches, wherein the first type switches are switches capable of transitioning from an initial closed state to an open state, and the second type switches are switches capable of transitioning from an initial open state to a closed state.

In accordance with an aspect of the present invention, provided is a fusible switch including: two stationary electrodes separated from each other; a moving electrode capable of moving to contact or be separated from the stationary electrodes; a conductive bonding material positioned between the two stationary electrodes and the moving electrode; and a heating element, wherein a melting point of the conductive bonding material is lower than a melting point of the stationary electrodes and a melting point of the moving electrode, wherein the two stationary electrodes are electrically connected when the moving electrode contacts the two stationary electrodes, and are electrically disconnected when the moving electrode is separated from the two stationary electrodes, wherein the moving electrode is fusion-bonded to the two stationary electrodes by the conductive bonding material when the moving electrode contacts the two stationary electrodes, and the conductive bonding material is melted when heated through the heating element.

In accordance with another aspect of the present invention, provided is a fusible switch including: two stationary electrodes separated from each other; a moving electrode capable of moving to contact the two stationary electrodes; a conductive bonding material positioned between the two stationary electrodes and the moving electrode; and a heating element, wherein a melting point of the conductive bonding material is lower than a melting point of the stationary electrodes and a melting point of the moving electrode, wherein the conductive bonding material is fusible by heating of the heating element, and when the conductive bonding material positioned between the moving electrode and the two stationary electrodes is melted by heat of the heating element and then solidified, the moving electrode is fusion-bonded to the two stationary electrodes and the two stationary electrodes are electrically connected.

In accordance with another aspect of the present invention, provided is a fusible switch including: two stationary electrodes separated from each other; a moving electrode capable of moving to be separated from the two stationary electrodes; a conductive bonding material positioned between the two stationary electrodes and the moving electrode and fusion-bonding the two stationary electrodes with the moving electrode; a heating element, wherein a melting point of the conductive bonding material is lower than a melting point of the stationary electrodes and a melting point of the moving electrode, wherein the conductive bonding material is fusible by heating of the heating element, and when the moving electrode is moved so as to be separated from the two stationary electrodes after the conductive bonding material positioned between the moving electrode and the two stationary electrodes is melted by heat of the heating element, the two stationary electrodes are electrically disconnected.

In accordance with another aspect of the present invention, provided is a fusible switch including: a first stationary electrode and a second stationary electrode separated from each other; a third stationary electrode and a fourth stationary electrode separated from each other; one moving electrode; a conductive bonding material positioned between the stationary electrodes and the moving electrode; and a heating element, wherein a melting point of the conductive bonding material is lower than a melting point of the stationary electrodes and a melting point of the moving electrode, wherein, when the moving electrode contacts the first stationary electrode and the second stationary electrode, the first stationary electrode and the second stationary electrode are electrically connected, and the third stationary electrode and the fourth stationary electrode are electrically disconnected, wherein, when the moving electrode contacts the third stationary electrode and the fourth stationary electrode, the first stationary electrode and the second stationary electrode are electrically disconnected, and the third stationary electrode and the fourth stationary electrode are electrically connected, wherein, when the moving electrode contacts two of the stationary electrodes, the moving electrode is fusion-bonded to the two stationary electrodes by the conductive bonding material, wherein, when the moving electrode is separated from the two stationary electrodes, the moving electrode is fusion-disconnected from the two stationary electrodes by the conductive bonding material, wherein the conductive bonding material is melted when heated through the heating element.

In accordance with another aspect of the present invention, provided is a fusible switch including: two stationary electrodes separated from each other; a moving electrode capable of moving to contact the two stationary electrodes; a conductive bonding material positioned between the two stationary electrodes and the moving electrode, wherein a melting point of the conductive bonding material is lower than a melting point of the stationary electrodes and a melting point of the moving electrode, wherein the two stationary electrodes are electrically connected when the moving electrode contacts the two stationary electrodes, and are electrically disconnected when the moving electrode is separated from the two stationary electrodes, wherein, when the moving electrode moves to contact the two stationary electrodes and comes into contact with the two stationary electrodes while an open voltage allowing an on-current to be applied to both ends of the two stationary electrodes is applied, the on-current flows between the two stationary electrodes via the moving electrode and the conductive bonding material, the conductive bonding material is melted by Joule heat of the on-current and is then solidified when on resistance between the two stationary electrodes is lowered.

The heating element may be formed inside the moving electrode to maximize heating efficiency, at least one hole may be formed in the moving electrode, and the heating element in an insulated state may be inserted into the hole.

The heating element may be attached to a portion of a surface of the moving electrode other than a contact surface of the moving electrode brought into contact with the two stationary electrodes.

The moving electrode may have one or more branch lines, and the heating element may be provided on the branch lines.

The branch lines may be branched from the moving electrode at a position where heat transfer to contact portions of the moving electrode and the two stationary electrodes becomes symmetrical.

The number of the branch lines may be greater than or equal to 2, and ends of the branch lines may be connected to form a closed loop.

The heating element may be provided on a surface and inside of the branch lines.

The heating element may be positioned such that a heat transfer path is formed along the heating element, the moving electrode, contacts of the stationary electrodes, and electrode side terminals of the stationary electrodes.

The fusible switch may further include a feed force generation means for generating force capable of shifting a position of the moving electrode.

The feed force generation means may be capable of controlling a contact pressure generated when the moving electrode contacts the two stationary electrodes.

Bumps and depressions may be formed on a surface of the surfaces of the moving electrode and the stationary electrodes, the surface being fusion-bonded through the conductive bonding material.

A part or entirety of a surface of the conductive bonding material may have bumps and depressions.

Power to the heating element may be supplied or cut off by a power supply positioned outside the heating element.

The feed force generation means may be connected to the moving electrode via a transfer link, wherein the transfer link may be formed of a flat plate-shaped partition insulator moving across a gap between the two stationary electrodes to prevent shorting between the two stationary electrodes.

The fusible switch may further include a feed restraining means for supporting the moving electrode so as not to move in a specific direction.

The fusible switch may further include a support member for supporting the moving electrode so as not to move in a specific direction, wherein the support member may melt at a temperature lower than the melting points of the two stationary electrodes and the moving electrode.

The feed force generation means may be constrained by a fuse wire to interrupt the feed force applied to the moving electrode, wherein, when the fuse wire is melted and cut by supply of current, the feed force of the feed force generation means may be applied to the moving electrode.

In the fusible switch, the stationary electrodes or the moving electrode bonded through the conductive bonding material may be provided with a groove along a rim of the contacts.

In the fusible switch, a concave portion may be formed in an electrode positioned on a lower side (an electrode positioned in a direction of action of gravity) among the stationary electrodes and the moving electrode bonded through the conductive bonding material, and the conductive bonding material may be positioned in the concave portion.

In the fusible switch, a semiconductor switch may be connected in parallel to both ends of the two stationary electrodes to provide a path of the on-current during fusion disconnection or fusion bonding to suppress arc generation at both the ends of the stationary electrodes.

The fusible switch may further include a current detection means for measuring a current flowing through the fusible switch to minimize an on time of the semiconductor switch.

In accordance with yet another aspect of the present invention, provided is a fusible switch includes a first stationary electrode; a second stationary electrode; a moving electrode; a conductive bonding material positioned between the first and second stationary electrodes and the moving electrode; a heating element; a feed force generation means for generating a force for moving the moving electrode to the first stationary electrode; and a feed restraining means for preventing the moving electrode from moving to the first stationary electrode, wherein the moving electrode is electrically connected to the second stationary electrode before heating of the heating element, and after the heating of the heating element, the conductive bonding material melts and the feed restraining means allows movement of the moving electrode such that the moving electrode is fusion-bonded and electrically connected to the first stationary electrode through the conductive bonding material.

In the fusible switch, a portion of the stationary electrodes which contacts the moving electrode may be formed to be thinner than a portion of the stationary electrodes which does not contact the moving electrode.

The moving electrode may be moved after power is supplied to the heating element for a predetermined time in order to preheat the moving electrode before the fusible switch performs fusion bonding.

The fusible switch may be included in a battery control apparatus.

In accordance with an aspect of the present invention, provided is a method of preventing generation of an arc in a fusible switch during operation of the fusible switch using the fusible switch and a semiconductor switch connected in parallel to the fusible switch, the method including: a first step of issuing an ON command for the semiconductor switch; a second step of issuing an operation command for the fusible switch; and a third step of issuing an OFF command for the semiconductor switch.

In accordance with another aspect of the present invention, provided is a method of preventing generation of an arc in a fusible switch including a heating element and a feed force generation means during operation of the fusible switch using the fusible switch and a semiconductor switch connected in parallel to the fusible switch, the method including: a first step of issuing a semiconductor switch ON command, a heating element operation start command, and a feed force generation command for a moving electrode; a second step of checking completion of fusion disconnection; and a third step of issuing a semiconductor switch OFF command and a heating element operation end command.

The completion of the fusion disconnection in the second step may be checked by measuring a current flowing through the fusible switch by a current detection means for measuring the current of the fusible switch.

Advantageous Effects

According to the present invention, a control apparatus for a battery including a plurality of battery cells connected to each other may automatically exclude faulty battery cells from the connection and address voltage drop and discontinuity of charge/discharge current.

The fusible switch of the present invention is a fusible switch of a press-contact method which does not cause movement of an electrode side terminal. Accordingly, the distance between the electrodes is minimized and fusion bonding between the electrodes is completely achieved regardless of the on-current condition of the switch. Therefore, a compact/lightweight switch allowing a large amount of current to flow therethrough and having low on resistance can be achieved.

In addition, a reversible operation (return operation after switch operation) may be performed, and on/off control independent of the on-current of the switch may be performed.

The fusible switch of the present invention may be used not only as a close switch but also as an open switch.

BEST MODE

Figure 1:
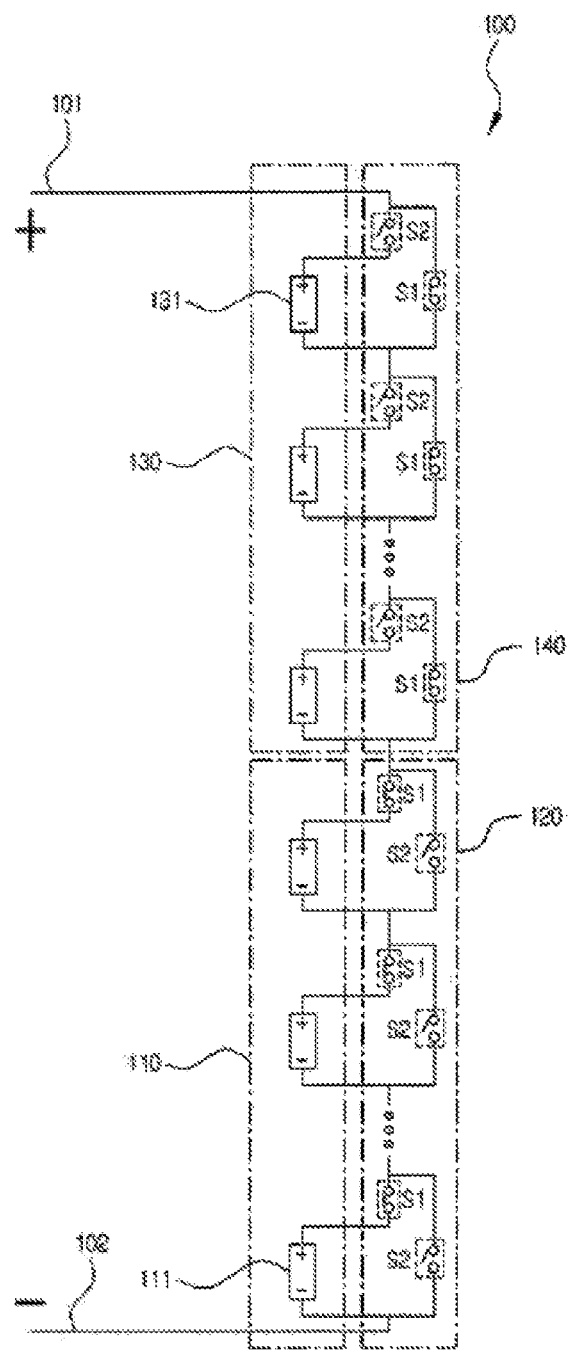
FIG. 1 is a diagram of a battery block of the present invention.

While the invention is susceptible to various modifications and alternative forms, specific embodiments thereof are shown by way of example in the drawings and will herein be described in detail. It should be understood that the invention is not intended to be limited to specific embodiments, but includes all modifications, equivalents, and alternatives falling within the spirit and scope of the invention. Further, in the following description of the present invention, a detailed description of known functions and configurations incorporated herein will be omitted for the purpose of clarity.

Terms used in this specification are merely adopted to describe specific embodiments, and are not intended to limit the present invention. A singular expression includes a plural expression unless the two expressions are contextually different.

In the following description, "first type switch" refers to a switch capable of transitioning from an initial closed state to an open state, and the "second type switch" refers to a switch capable of transitioning from an initial open state to a closed state.

In addition, a unit of a battery cell group including a plurality of battery cells connected in series is referred to as a "battery module".

In addition, a battery module coupled to a switching device may be referred to as a "battery block", and multiple battery blocks may constitute one battery pack.

FIG. 1 is a diagram of a battery block of the present invention.

The battery module of FIG. 1 includes a basic battery (cell) group 110 having a plurality of basic battery cells 111 connected in series and a replacement battery (cell) group 130 having a plurality of replacement battery cells 131 connected in series, the basic battery (cell) group 110 and the replacement battery (cell) group 130 being connected in series.

A first type switch S1 is connected in series to each of the basic battery cells, and a second type switch S2 is connected in parallel to each of the basic battery cells. Regarding the position of the second type switch S2, it may be said that the second type switch is connected in parallel to a path where the first type switch is connected in series.

A first type switch S1 is connected in parallel to each of the replaceable battery cells, and a second type switch S2 is connected in series to each of the replaceable battery cells. Here, regarding the position of the first type switch S1, it may be said that the first type switch is connected in parallel to a path where the second type switch is connected in series.

The battery cell may be a battery cell having a plurality of lower battery cells.

In the initial state, the first type switch S1 is closed and the second type switch S2 is open, and therefore all of the basic battery cells are in the operating state, while none of the replacement battery cells are in the operating state. That is, the basic battery cells are included in an electricity flow line (a line through which electricity flows), and the replacement battery cells are not included in the electricity flow line. In this case, the voltage between the module positive terminal 101 and the module negative terminal 102 is equal to the sum of the output voltages of the basic battery cells.

If the controller of the battery control apparatus detects a faulty battery cell among the battery cells in operation, the controller performs a control operation to exclude the faulty battery cell from the electrical connection and replace the faulty battery cell with a replacement battery cell.

It is apparent that in order for the controller to detect a faulty battery cell, a sensing unit for measuring the condition of each battery cell (for example, a device for measuring the voltage, current, and temperature of each battery cell) should be provided and the measurement result should be transmitted to the controller. Since this technique is already known and is not related to the features of the present invention, a detailed description thereof will be omitted.

Hereinafter, a process of performing a control operation to exclude a faulty battery cell from the electrical connection and replace the faulty battery cell with a replacement battery will be described in detail.

The controller sends, to a first type switch connected to the faulty battery cell, a signal instructing transition to the open state, and sends, to a second type switch connected to the faulty battery cell, a signal instructing transition to the closed state. Then, the faulty battery cell is excluded from the electricity flow line, and electricity is not supplied to the faulty battery cell.

The controller then selects one replacement battery cell in the replacement battery cell group 130. Then, the controller sends, to a first type switch connected to the selected replacement battery cell, a signal instructing transition to the open state, and sends, to a second type switch connected to the selected replacement battery cell, a signal instructing transition to the closed state. Then, the selected replacement battery cell is included in the electricity flow line, and thus electricity can flow to the selected replacement battery cell.

After the above process, the process of replacing the faulty basic battery cell with a replacement battery cell is completed.

Here, since the switches connected to the basic battery cells are used for cell separation, they can be referred to as a "cell separation switching unit 120". Since the switches connected to the replacement battery cells are used for cell replacement, they can be referred to as a "cell replacement switching unit 140".

If a replacement battery is included in the electricity flow line after excluding the faulty battery cell, the output voltage of the battery module does not drop even after the faulty battery cell is excluded.

The battery block 100 of FIG. 1 includes a basic battery group 110, a cell separation switching unit 120, a replacement battery group 130, and a cell replacement switching unit 140.

The configuration of FIG. 1 may be changed.

Figure 2:
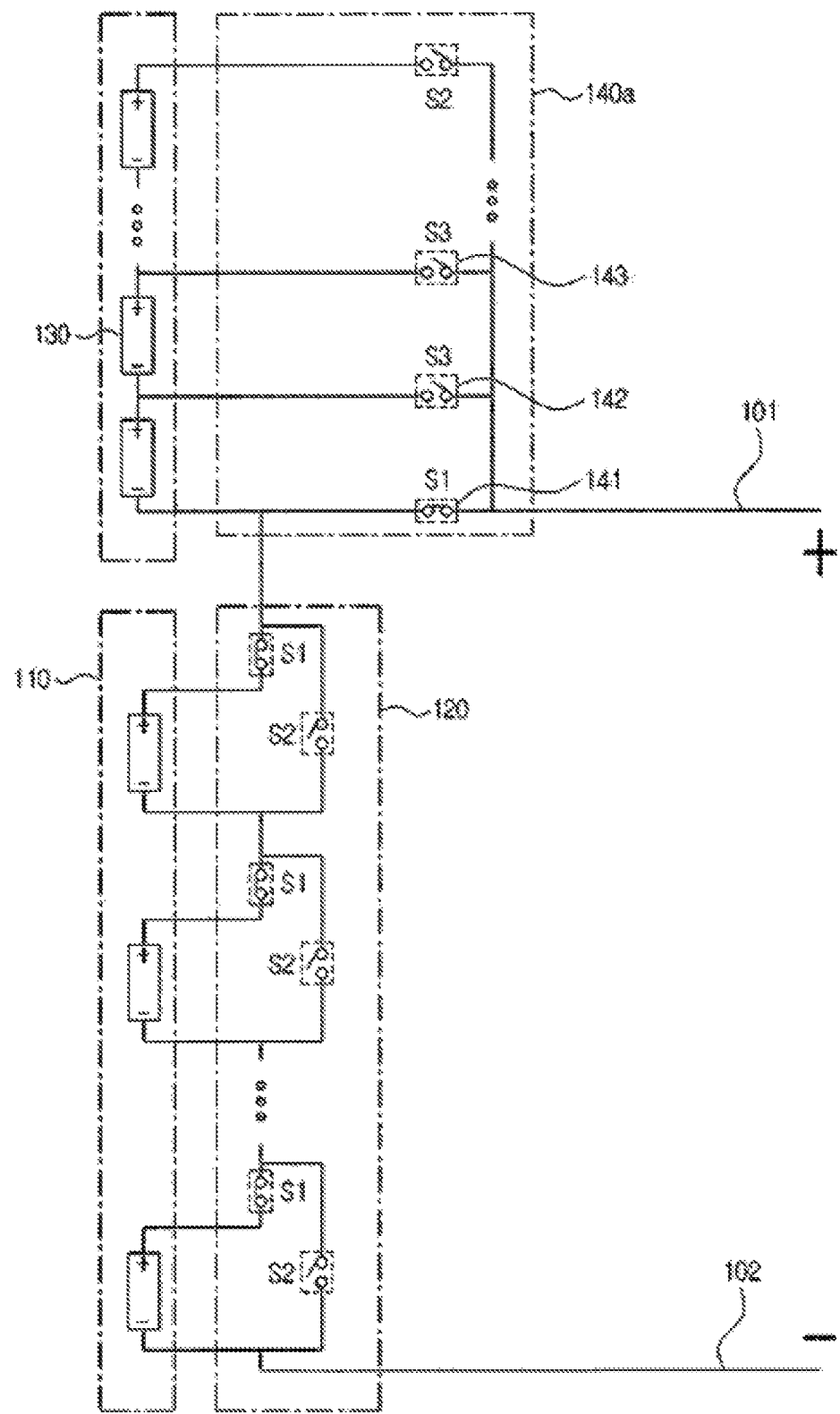
FIG. 2 is a diagram of a modified embodiment of the battery block of the present invention.

FIG. 2 is a diagram of a modified embodiment of the battery block of the present invention.

FIG. 2 is different from FIG. 1 in the configuration of the cell replacement switching unit 140a.

If N replacement battery cells are connected in series in the replacement battery group 130 and a switch is arranged between a terminal (positive pole or negative pole) of each replacement battery cell and a module positive terminal 101, (N+1) switches may be installed as shown in FIG. 2.

In this case, a first type switch is provided at a terminal connected to the basic battery cell group 110, and a second type switch is provided at a terminal connected to the side farthest from the basic battery group 110.

The (N−1) remaining terminals are provided with a third type switch.

The "third type switch" is a switch capable of transitioning from an initial open state to a closed state and from the closed state back to the open state.

Since the third type switch can transition from the initial open state to the closed state, it may be regarded as a second type switch.

Hereinafter, operation of the battery control apparatus of FIG. 2 will be described.

The process of excluding a faulty battery cell from the electrical connection when the controller of the battery control apparatus detects the faulty battery cell among the battery cells in operation is the same as that of the battery control apparatus of FIG. 1

The difference lies in the operation of a cell replacement switching unit 140a for connecting a replacement battery.

If the first battery cell is a faulty battery cell, a switch 141, is opened and a switch 142, which is the next switch, is closed. If another battery cell is found faulty, the switch 142 is opened and a switch 143, which is the next switch, is closed. By repeating this process, as many replacement batteries as the number of faulty batteries may be included in the electricity flow line, and thus the voltage of the battery module may be kept constant.

Compared to the battery control apparatus of FIG. 1, the battery control apparatus of FIG. 2 may reduce the number of switches of the cell replacement switching unit 140a and lower resistance by the switches according to reduction in the number of switches on the electricity flow line. However, if the first one of the replacement batteries is faulty, all the other replacement batteries cannot be used.

The battery control apparatus of the battery modules of FIGS. 1 and 2 may output the same voltage even after the faulty battery cell is replaced, but the voltage may become discontinuous during the replacement process. Therefore, the battery modules are preferably connected in parallel, and a battery module (or battery block) requiring replacement of a battery cell is disconnected from the parallel connection during battery cell replacement.

Figure 3:
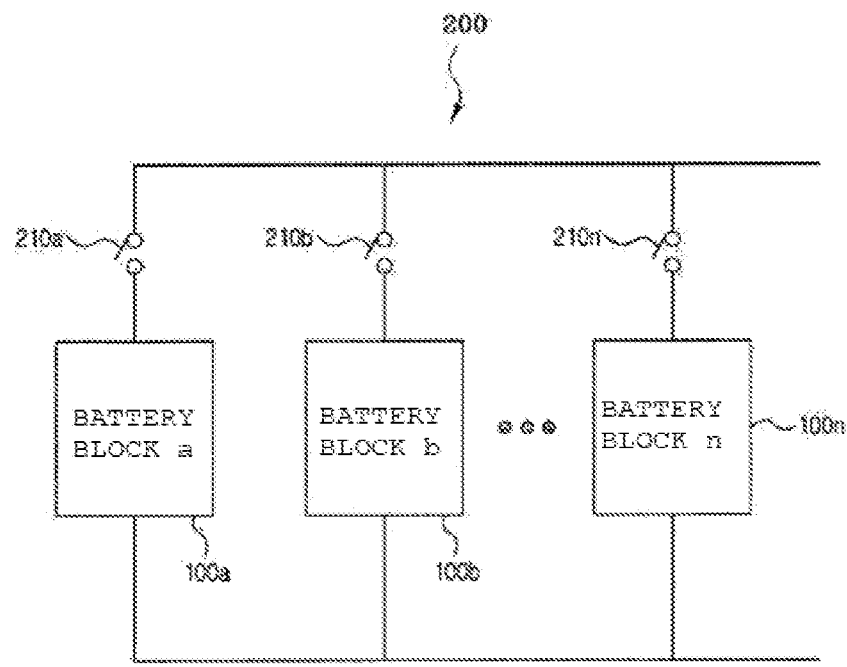
FIG. 3 is a diagram showing multiple battery blocks connected to each other.

FIG. 3 is a diagram showing multiple battery blocks connected to each other.

The battery control apparatus 200 of FIG. 3 includes n battery blocks 100a to 100n connected in series, and the module switches 210a to 210n are connected in series to each battery block.

Each of the battery blocks includes a switching unit (a cell separation switching unit and a cell replacement switching unit) of FIG. 1 or 2, a basic battery group, and a replacement battery group.

Upon detecting a faulty basic battery cell, the controller of an automatic battery cell changer performs a control operation to operate the first type switch and the second type switch connected to the faulty battery cell to exclude connection of the faulty basic battery cell from the electricity flow line and to operate the first type switch and the second type switch connected to a replacement battery cell selected in a battery module having the faulty battery cell such that the replacement battery cell is included in the electricity flow line. In addition, to prevent the output voltage from being interrupted during the replacement operation in the corresponding battery module, the module switch of the battery module is opened during the replacement operation.

Accordingly, operation of the battery control apparatus of FIG. 3 includes the following steps:

(1) the controller of the battery control apparatus detecting a faulty battery cell among the basic battery cells from an input of the sensing unit;

(2) the controller of the battery control apparatus opening a module switch of a battery module including the faulty battery cell;

(3) the controller of the battery control apparatus operating a first type switch and a second type switch connected to the faulty battery and excluding connection of the faulty basic battery cell from an electricity flow line;

(4) the controller of the battery control apparatus operating a first type switch and a second type switch connected to a replacement battery cell and including the replacement battery cell in the electricity flow line; and (5) the controller of the battery control apparatus closing the module switch of the battery module including the faulty battery cell.

The battery control apparatus of FIG. 3 is advantageous in that the output voltage of the battery is kept constant during the replacement operation of the faulty battery cell.

The controller of the battery control apparatus may determine whether a battery cell is faulty by receiving information on the condition of the battery cell from a measurement unit for measuring the condition of the battery cell, and transmit a control signal (instructing opening or closing of a switch) to a switch connected to the battery control apparatus.

The controller of the battery control apparatus described above refers to an element that controls the battery control apparatus among the elements of the battery control apparatus. Here, the battery control apparatus is an apparatus including a battery controller and switching units (a cell separation switching unit, a cell replacement switching unit, and the like).

The controller of the battery control apparatus may be implemented using the conventional battery management system (BMS) technology.

The controller may be divided into a controller of each battery module and a controller of the entire battery pack that connects the battery modules, but will be collectively referred to as a controller for simplicity in the present application.

In addition, the first type switch and the second type switch in FIGS. 1 and 2 may be modified into a single switch.

Figure 4:
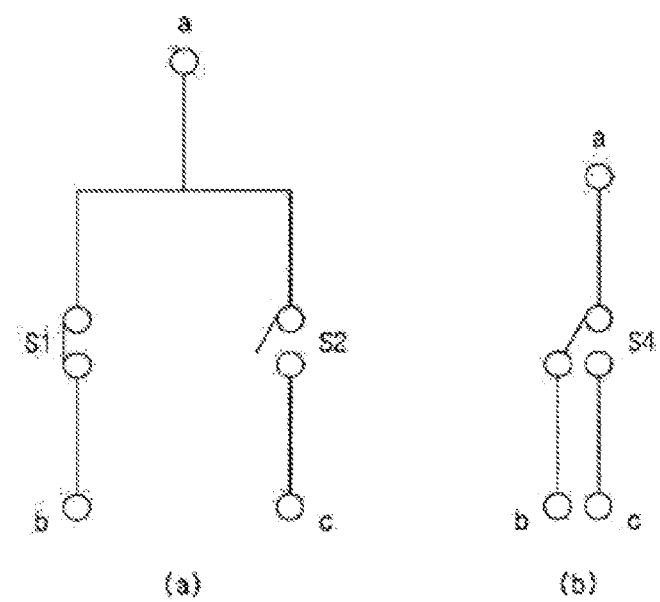
FIG. 4 is a diagram showing a modification of a first type switch and a second type switch.

FIG. 4 is a diagram showing a modification of a first type switch and a second type switch.

FIG. 4(*a*) is a diagram of a first type switch and a second type switch, and FIG. 4(*b*) is a diagram of one switch (a fourth type switch) corresponding to FIG. 4(*a*).

The fourth type switch of FIG. 4(*b*) may transition from an initial state in which terminal a is connected with terminal b and disconnected from terminal c to another state in which terminal a is disconnected from terminal b and connected with terminal c.

The fourth type switch of FIG. 4(*b*) has the same function as "the first type switch and the second type switch of FIG. 4(*a*)."

The "second type switch" is called an "a-contact (make contact) switch" or a "one-way close switch," and the "first type switch" is called a "b-contact (break contact) switch" or a "one-way open switch."

A one-way switch refers to a switch having a single line through which current flows like the first type switch or the second type switch.

A switch combining the first type switch and the second type switch, namely, a switch as shown in FIG. 4(*a*), has two lines through which current flows, and thus may be referred to as a "two-way switch" or a c-contact (change-over contact) switch. This switch will be referred to as a c-contact switch in the present invention.

The battery control apparatus of FIGS. 1 to 3 includes a plurality of first type switches and second type switches, and a large amount of current flows through these switches. With the conventional mechanical contact switch technology, a compact/lightweight switch exhibiting high impact resistance and low contact resistance when a large amount of current flows cannot be produced.

Therefore, the switch of the present invention is formed as a fusible switch in order to produce a small/lightweight switch having low on resistance. The fusible switch refers to a switch in which a conductive bonding material between two electrodes is fused during operation of the switch. The conductive bonding material may be referred to as a soldering material.

That is, a conductive bonding material (for example, an alloy of lead, silver, tin, copper, or indium) is placed between two conductors constituting two electrodes. Then, to electrically connect the two electrodes, the conductive bonding material is melted, brought into contact with the two electrodes, and then solidified. To electrically separate the two electrodes, the conductive bonding material is melted and removed.

In this case, when the conductive bonding material melts, the two conductors should not melt. Therefore, the melting point of the conductive bonding material is preferably lower than the melting point of the two electrodes.

Therefore, the fusible switch of the present invention includes both soldering and brazing that are classified according to the melting point temperature since the electrodes are not melted but only the conductive bonding material is melted. Accordingly, the term "soldering" used herein encompasses the meaning of brazing as well.

Figure 5:
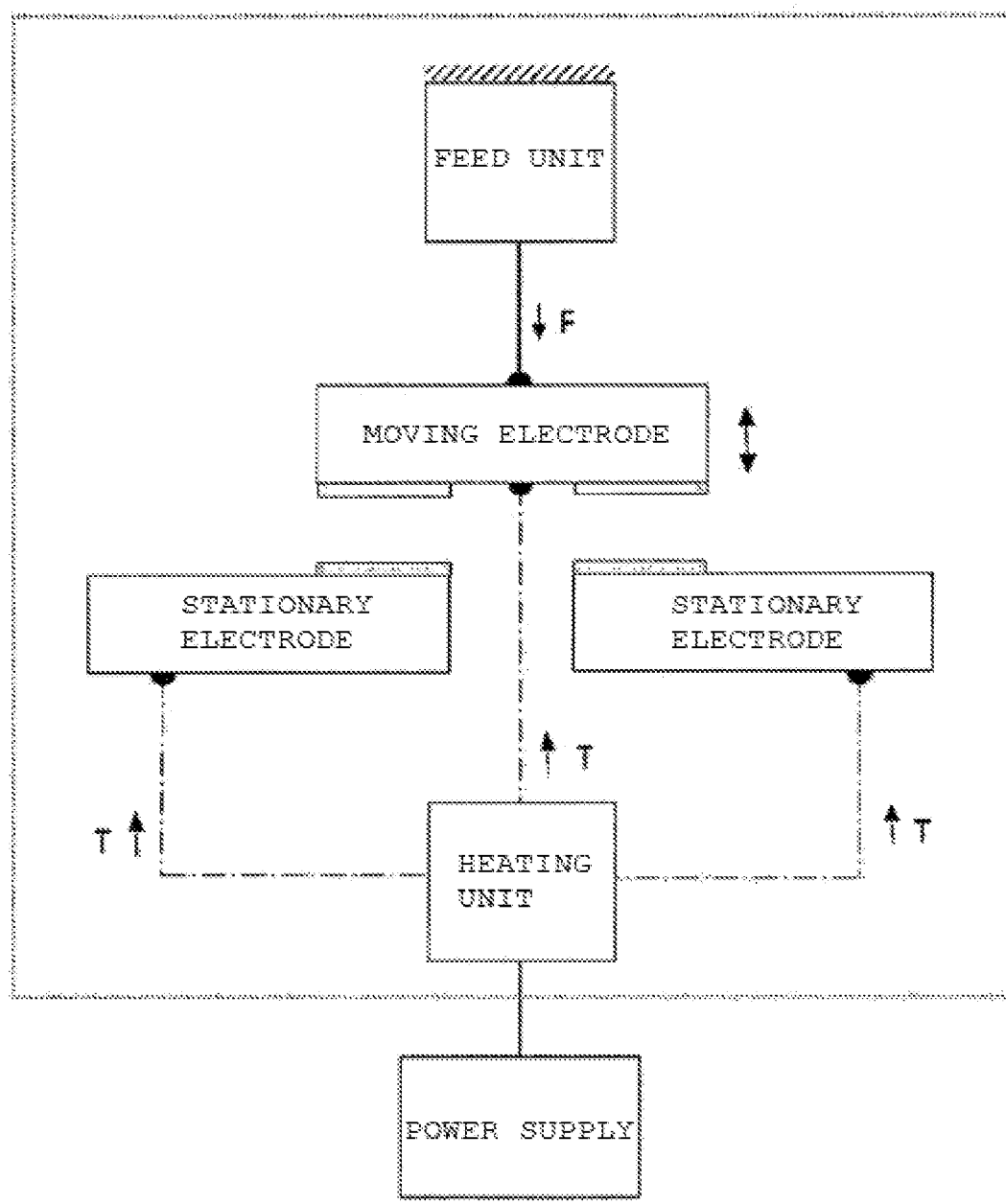
FIG. 5 is a conceptual diagram of a one-way fusible switch according to the present invention.

FIG. 5 is a conceptual diagram of a one-way fusible switch according to the present invention. One-way fusible switches include an a-contact fusible switch (make contact-fusible switch) and a b-contact fusible switch (break contact-fusible switch).

The a-contact fusible switch (make contact-fusible switch) means a fusible switch that implements the function of a make contact switch, and a b-contact fusible switch (break contact-fusible switch) means a fusible switch that implements the function of a b-contact switch (break contact switch).

"One-way fusible switch" may also be used as a concept including the a-contact fusible switch (make contact-fusible switch) and the b-contact fusible switch (break contact-fusible switch).

As shown in FIG. 5, the one-way fusible switch includes two stationary electrodes separated from each other, and a moving electrode capable of moving so as to press-contact (or contact) or be separated from the electrodes, a feed unit for providing feed force to the moving electrode to cause the moving electrode to unidirectionally or bidirectionally move, a conductive bonding material (soldering material) for performing fusion bonding in a soldering state or fusible disconnection in a desoldered state between the stationary electrodes and the moving electrode, and a heating unit.

The feed unit may include a means for generating feed force (for example, a spring, a motor, an electromagnet, etc.). The feed unit transmits a force for moving the moving electrode, that is, a feed force F, to the moving electrode.

The heating unit is a part for supplying heat to melt the conductive bonding material located at the contact point between the stationary electrodes and the moving electrode, and includes a heating element for generating heat. The heating unit may supply heat to all of the moving electrode and the two stationary electrodes, or may supply heat to only a portion of the moving electrode and the two stationary electrodes. In FIG. 5, the heat supplied by the heating element is denoted by T.

When the heating element is a device that generates heat by electricity, the heating element requires a power supply for supplying electricity. The power supply may supply or cut off power to the heating element.

Hereinafter, a specific embodiment of the a-contact fusible switch will be described below.

Figure 6:
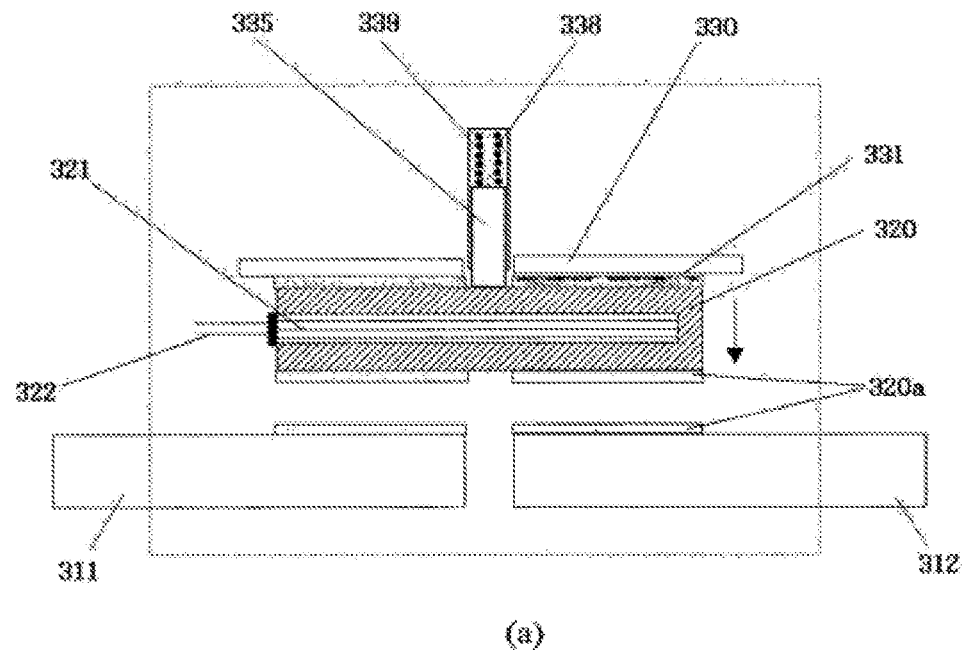
FIG. 6 shows the states of a first embodiment of an a-contact fusible switch before and after the operation thereof.
Figure 6:
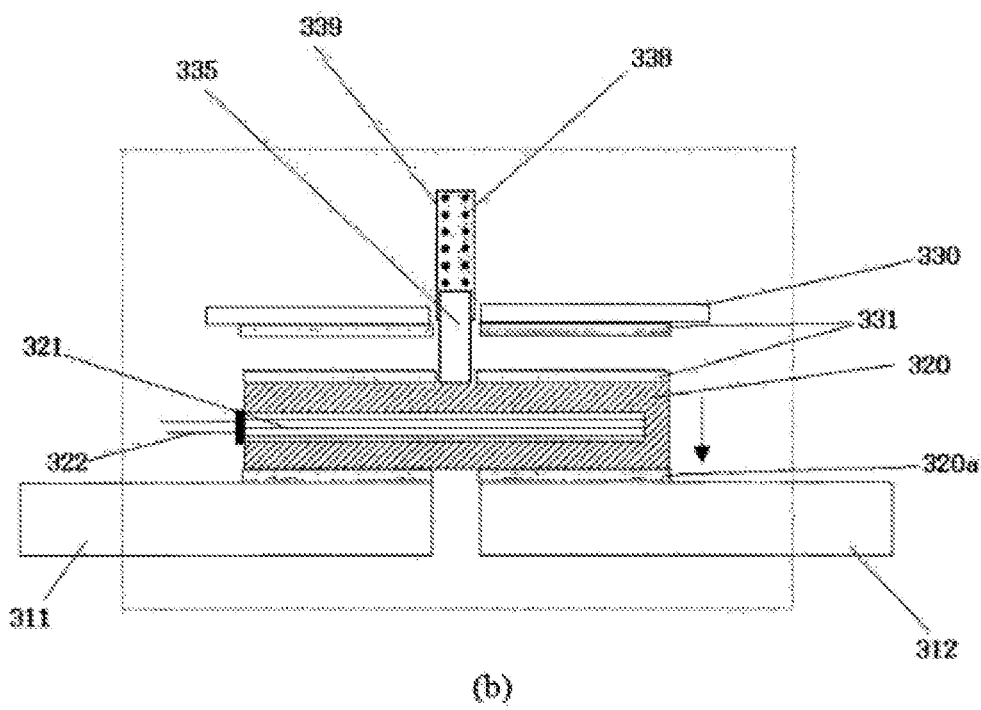

FIG. 6 shows the states of a first embodiment of an a-contact fusible switch before and after the operation thereof.

FIG. 6(*a*) shows the a-contact fusible switch before the operation thereof.

In the initial state of the fusible switch of FIG. 6, the moving electrode 320 is fixed to a hold portion 330 in a fusion bonding manner, and a stationary electrode 311 and a stationary electrode 312 are in an open state in which electricity does not pass therethrough.

The two stationary electrodes in FIG. 6(*a*) are spaced apart from each other and thus electrically separated. Therefore, it can be said that the two stationary electrodes are insulated and separated. That is, since insulation can be implemented either by air or vacuum or by an insulator, the two stationary electrodes in FIG. 6(*a*) can be said to be insulated and separated.

The hold portion 330 serves to fix the moving electrode 320 in order to provide durability against external impact. A low-temperature fusible material 331 is present between the moving electrode 320 and the hold portion 330 to fusion-bond the moving electrode 320 and the hold portion 330. The low-temperature fusible material 331 has a lower melting point than the melting points of the moving electrode 320 and the hold portion 330, and may be a conductive material or a non-conductive material.

The lower portion of the moving electrode 320 and the upper portions of the two stationary electrodes 311 and 312 are plated or coated with a conductive bonding material 320*a*. The melting point of the conductive bonding material 320*a* is lower than the melting point of the stationary electrodes 311 and 312 and the melting point of the moving electrode 320. A representative example of the conductive bonding material 320*a* is a solder.

A heating element 321 configured with an insulated hot wire is present inside the moving electrode 320 and a heating element power supply line 322 is connected to a power supply for the heating element.

A spring 338 and a spring housing 339 constitute a feed force generation means.

The feed force generation means of FIG. 6 generates feed force by the elastic force of the spring 338.

The transfer link 335 serves to transfer the feed force applied by the spring to the moving electrode 320. The transfer link 335 is preferably attached to the moving electrode 320.

The feed force generation means of FIG. 6 generates a feed force, but the moving electrode 320 cannot move because the moving electrode 320 is fixed to the hold portion 330 by the low-temperature fusible material 331.

FIG. 6(*b*) shows the a-contact fusible switch after the operation thereof.

In FIG. 6(*a*), when electric power is supplied to the heating element 321 and thus heat is generated, the low-temperature fusible material 331 is melted. Therefore, the moving electrode 320 is moved down by the feed force of the feed force generation means. The conductive bonding material 320*a* is also melted by heat from the heating element.

Thereafter, when the power supplied to the heating element 321 is cut off, the conductive bonding material 320*a* is solidified while being in contact with the moving electrode 320 and the two stationary electrodes 311 and 312. This state may be called a fusion-bonded state. As a result, the two stationary electrodes 311 and 312 become electrically connected.

Since the two stationary electrodes 311 and 312 are spaced by a sufficient distance, a good withstand voltage characteristic is achieved. If an insulator is present between the two stationary electrodes 311 and 312, a better withstand voltage characteristic is achieved.

Since the two stationary electrodes 311 and 312 in FIG. 6(*b*) have a structure contacting the moving electrode 320 and are adhered to the moving electrode 320 as closely as possible while having a good withstand voltage characteristic, the on resistance between the two stationary electrodes 311 and 312 is very low.

In addition, since the switch of FIG. 6 provides a structure capable of operating even when the two stationary electrodes 311 and 312 are thick conductors having no bendability, the on resistance of the switch may be minimized, and thus the size of the switch may be reduced compared to the large current capacity of the switch.

Even if there is no feed force generation means, the moving electrode 320 can move downward (in the direction of gravity) due to gravity. However, if there is no feed force generation means, the contact pressure for fusion bonding may be weak, and the mounting direction for moving the moving electrode may be limited.

In order to overcome these issues, it is preferable to separately provide a feed force generation means for moving the moving electrode rather than solely depending on the weight of the moving electrode in moving the moving electrode.

The feed force generation means may be a means that generates force by a motor (including a linear motor), an electromagnet, or the like, or a means that uses a repulsive force or an elastic force between permanent magnets (for example, a device using a leaf spring, a compression spring, or the like). Depending on the requirements in the application field, it is possible to generate unidirectional or bidirectional feed force using various other methods.

In this case, a bidirectional feed force generation means for generating a force by a motor, an electromagnet, or the like can perform a switch operation in both directions, but becomes somewhat complicated. Further, with a feed force generation means using the repulsive force or the elastic force between the permanent magnets, a device for generating feed force only in one direction can be easily implemented, but it is difficult to implement a device for generating feed force in both directions.

As shown in FIG. 6, in an embodiment of the present invention, a compression spring which is easy to implement is employed as a typical feed force generation means to facilitate understanding.

Of course, a motor and an electromagnet which are bidirectional feed force generation means may be used instead of the compression spring. With the bidirectional feed force generation means, the fusible switch can perform the return operation after performing an operation. For example, the a-contact fusible switch can perform the operation of switching from the open state to the closed state and then perform the returning operation of returning to the open state.

That is, the state transition between the on-off contacts may be reversible.

The heating element 321 has a function of melting the conductive bonding material 320*a*. The heating element 321 may be installed anywhere as long as it can melt the conductive bonding material 320*a*. However, the heating element 321 is preferably mounted inside the moving electrode 320 to maximize the heat transfer efficiency of the heating element. As the heating element, a means that generates heat by gas, liquid fuel, gunpowder, or the like may be used, but an electric hot wire (a resistance wire that generates heat when electricity passes therethrough) is preferably used for safety and ease of control.

The stationary electrode and the moving electrode are conductors capable of conducting electric current and are preferably formed of a material having a good conductivity.

The moving electrode preferably has a high conductivity. When a heating element is arranged inside the moving electrode, a conductor having good thermal conductivity (e.g., copper) is preferably used as the moving electrode because heat conduction should be good.

In the fusible switch of the present invention, the conductive bonding material can be placed in various manners (for example, plating, coating, adhesion, physical fixation, etc.) that do not deteriorate the soldering property of the bonding portions of the conductors of the stationary electrodes and the moving electrode to which the conductive bonding material is to be fusion-bonded.

In particular, the conductive bonding material is more preferably attached to the bonding portions in a manner of plating (with, for example, an alloy of lead, tin, silver, copper, phosphor, etc.) or coating to protect the conductors of the stationary electrodes and the moving electrode from an external environment (corrosion, oxidization, and the like) and facilitate fusion bonding.

In addition, the conductive bonding material preferably contains a soldering catalyst (e.g., flux for soldering) to facilitate fusion bonding with the electrodes.

The contact resistance between the stationary electrodes and the moving electrode, the melting point temperature, and the mechanical/physical strength of the contact portions may be controlled by varying the physical properties of the components of the conductive bonding material according to the intended use and application.

In order to shorten the time for fusion bonding and fusion separation of the moving electrode, a heating element may be further provided in the stationary electrodes as well as the moving electrode.

The conventional fusible switch has low heat transfer efficiency in transferring heat to the conductive bonding material because the heating element for melting the conductive bonding material is arranged outside the electrode. If the heating element is installed inside the electrode as shown in FIG. 6, the area of contact between the electrode and the heating element may be increased to increase the amount of heat transferred to the electrode and the amount of generated heat of the electrode. Therefore, the efficiency of heat transfer to the conductive bonding material may become high, and thus the melting time may be shortened.

Further, in the embodiment of FIG. 6(a), there is also an advantage that the heat from the heating element cannot escape through the two stationary electrodes 311 and 312.

Figure 7:
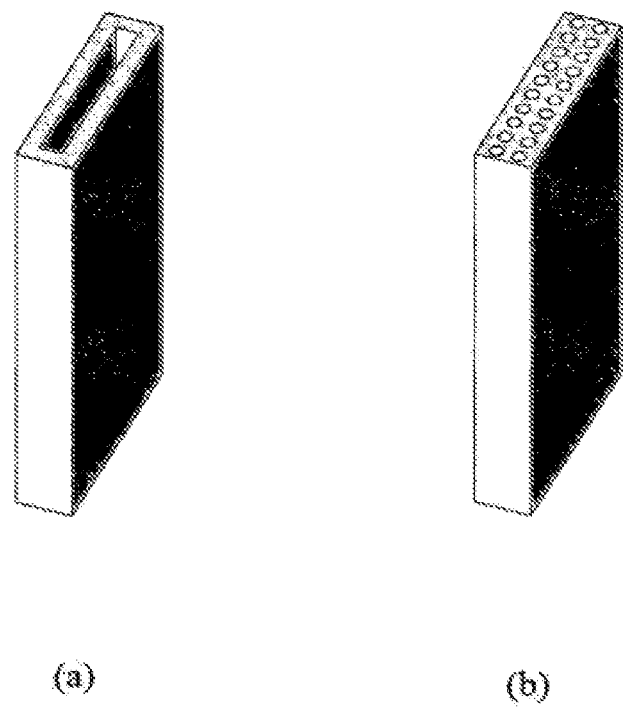
FIG. 7 shows an example of the shape of a moving electrode for mounting a heating element in the moving electrode.

FIG. 7 shows an example of the shape of a moving electrode for mounting a heating element in the moving electrode.

As shown in FIG. 7(a), a through hole having a rectangular cross section is formed in the moving electrode so as to have a rectangular tube shape, and a planar heating element may be inserted into the through hole.

The heating element in the structure as shown in FIG. 7(a) has higher heat transfer efficiency than the conventional external heating element structure.

As shown in FIG. 7(b), a plurality of holes may be formed in the moving electrode and a heating element composed of insulated hot wires may be inserted into the through holes.

As the multiple hot wires are inserted into the multiple holes, the area of contact with the moving electrode is further increased, and thus the heat transfer efficiency is further increased.

Although multiple hot wires can be inserted into multiple holes, the heating element can function even when only one hot wire is inserted into one hole.

If the heating element is inserted into the moving electrode as in the example of FIG. 7, the area of contact between the heating element and the moving electrode may be maximized, thereby improving the heat transfer efficiency compared to a case of attaching the heating element to a side of the moving electrode.

Figure 8:
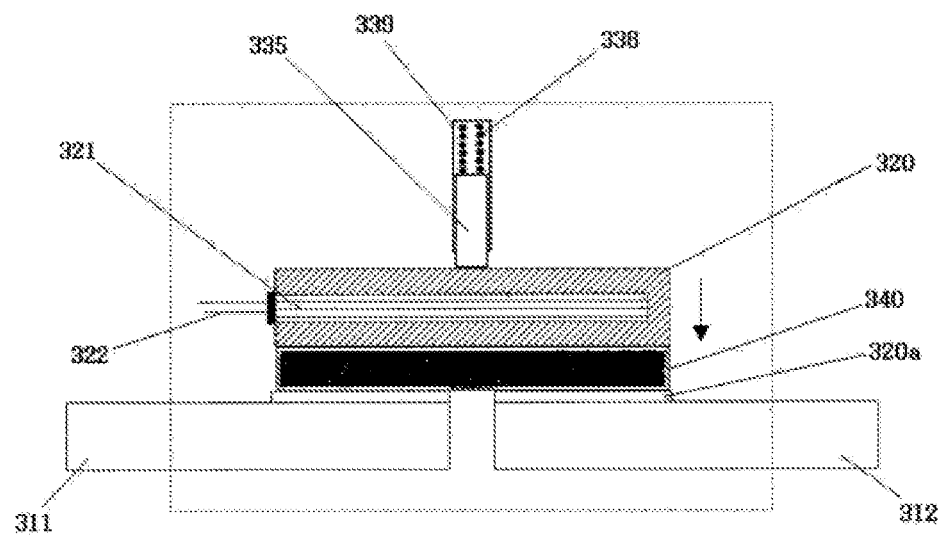
FIG. 8 shows the states of a second embodiment of the a-contact fusible switch before and after the operation thereof.
Figure 8:
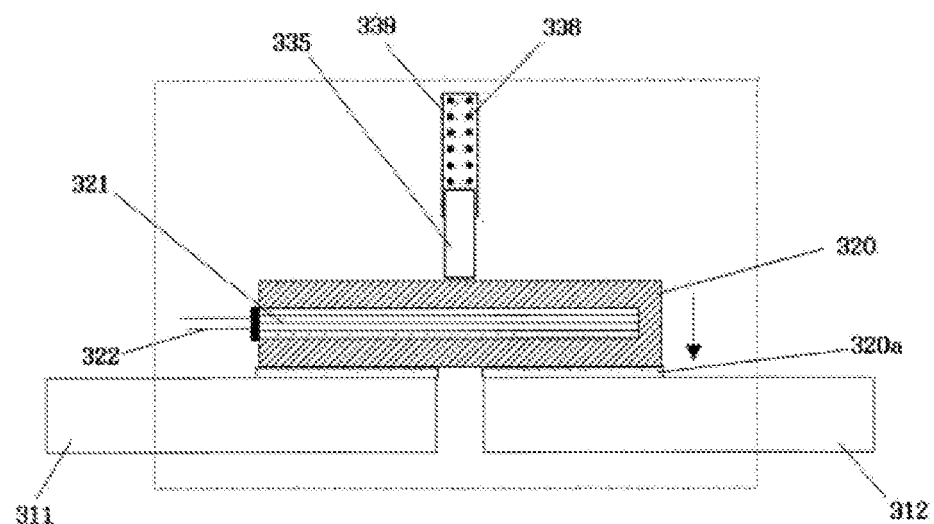

FIG. 8 shows the states of a second embodiment of the a-contact fusible switch before and after the operation thereof.

FIG. 8(a) shows a state before the operation of the a-contact fusion switch.

An insulative support member 340 is formed on the lower portion of the moving electrode 320 and on the upper portions of the two stationary electrodes 311 and 312. The lower portion of the moving electrode 320 and the upper portions of the two stationary electrodes 311 and 312 are plated or coated with the conductive bonding material 320a.

The insulative support member 340 (e.g., styrofoam, flux for soldering, etc.) should be formed of a material that is weak to heat but has a persistent support capability. That is, the insulative support member must have a lower melting point than the electrodes contacting the insulative support member.

FIG. 8(a) shows a state before the operation of the a-contact fusion switch, and FIG. 8(b) shows a state after the operation of the a-contact fusion switch.

When the heating element 321 of the moving electrode 320 generates heat, the heat of the heating element 321 raises the temperature of the moving electrode 320 and the insulative support member 340 is melted by the heat, losing the support capability thereof. Then, the moving electrode 320 is moved downward by the feed force of the feed force generation means, and then contacts the conductive bonding material 320a to melt the conductive bonding material 320a. Thereafter, when the heating element 321 stops generating heat, the conductive bonding material 320a solidifies and the moving electrode 320 and the stationary electrodes 311 and 312 are fusion-bonded.

The insulative support member 340 restricts movement of the moving electrode before the operation of the fusible switch. When the fusible switch operates, the insulative support member 340 is melted by heat and thus does not restrict the movement of the moving electrode.

In FIG. 8, the upper portions of the stationary electrodes 311 and 312 are illustrated as being plated or coated with the conductive bonding material 320a, the lower portion of the moving electrode 320 may be plated or coated with the conductive bonding material 320a, or both the upper portions of the stationary electrodes 311 and 312 and the lower portion of the moving electrode 320 may be plated or coated with the conductive bonding material.

In addition, the area of the insulative support member 340 may be the same as the area of the lower surface of the moving electrode 320. Alternatively, the area of the insulative support member 340 may be set to be much smaller than the area of the lower surface of the moving electrode 320.

Figure 9:
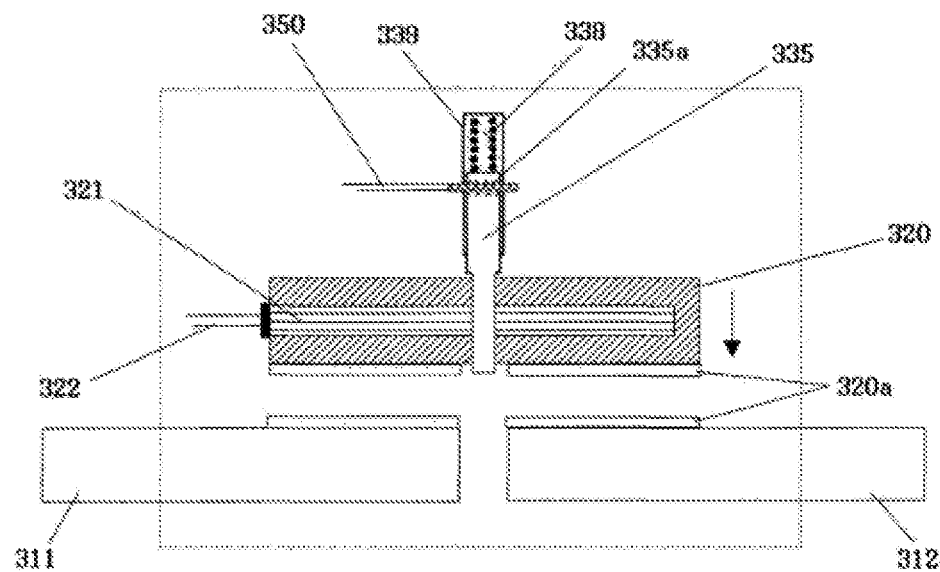
FIG. 9 shows the states of a third embodiment of the a-contact fusible switch before and after the operation thereof.
Figure 9:
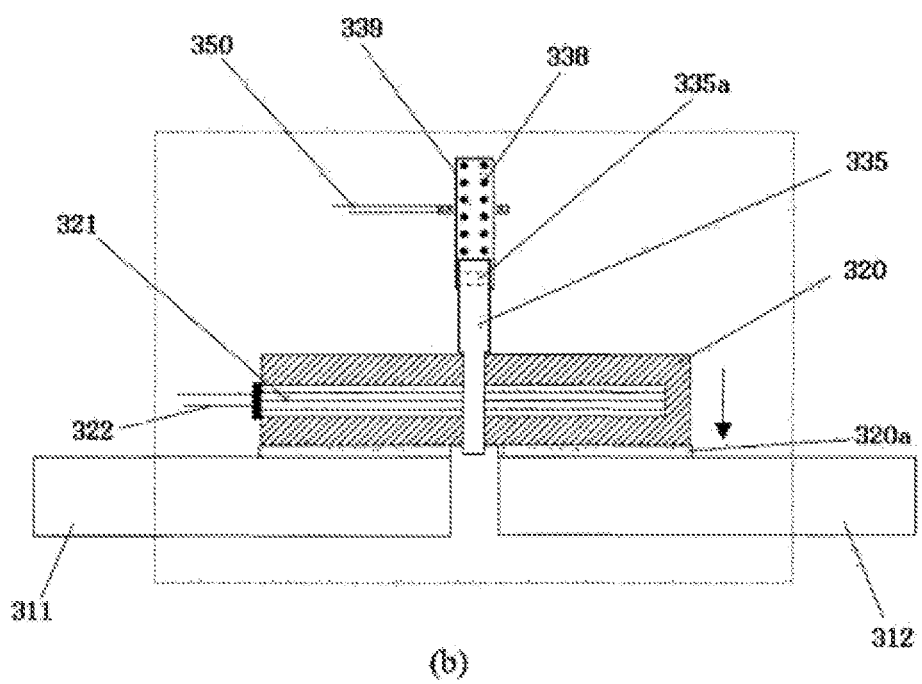

FIG. 9 shows the states of a third embodiment of the a-contact fusible switch before and after the operation thereof.

FIG. 9(a) shows a state before the operation of the a-contact fusion switch, and FIG. 9(b) shows a state after the operation of the a-contact fusion switch.

The two stationary electrodes 311 and 312 in FIG. 9(a) are spaced apart from each other and thus electrically separated.

The spring 338 and the spring housing 339 constitute a feed force generation means. However, a transfer link hole 335a is formed in the transfer link 335, and a fuse wire 350 is arranged through the transfer link hole 335a to fix the position of the transfer link 335.

During the switch operation, electric current is supplied to the heating element 321 and the fuse wire 350, and the fuse wire melts and breaks so that the elastic force of the constrained compressed spring 338 is transmitted to the moving electrode 320 via the transfer link 335.

In the above embodiment, which implements an a-contact fusible switch, and all the fusible switches of the present invention employing fusion bonding, in order to shorten the operating time and minimize temperature rise of the stationary electrode side terminals, the moving electrode may be sufficiently preheated using the compression spring 338 and the fuse wire 350 of FIG. 9 before fusion bonding takes place.

That is, if power is supplied to the heating element 321 of the moving electrode 320 for a predetermined time before the fuse wire 350 is disconnected, the moving electrode is heated to a high temperature before contacting the stationary electrode, and thus the fusion bonding operating time may be shortened and temperature rise of the stationary electrode side terminals may be minimized.

Figure 10:
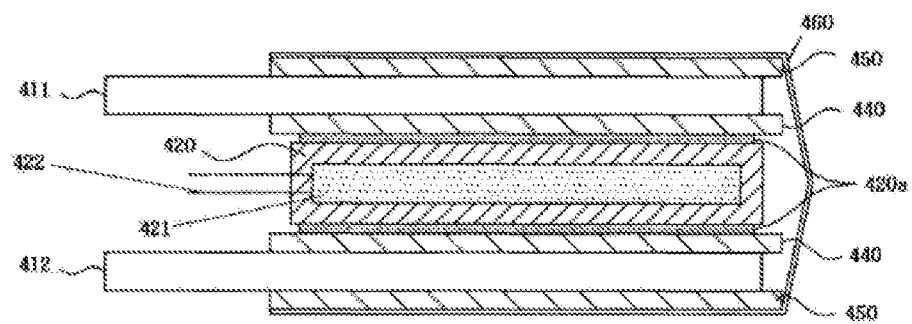
FIG. 10 shows the states of a modified embodiment of the a-contact fusion switch before and after the operation thereof.
Figure 10:
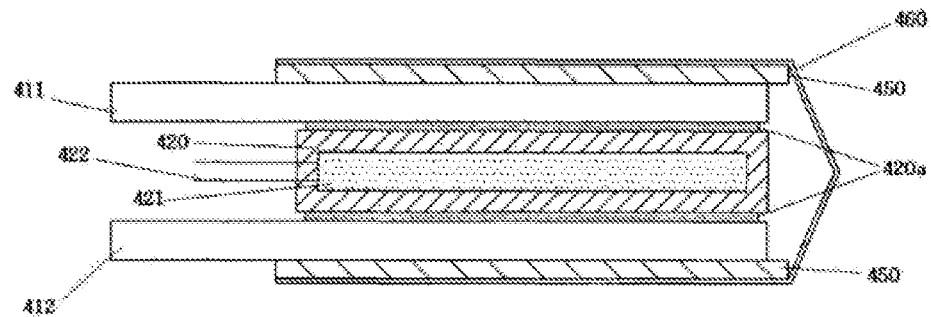

FIG. 10 shows the states of a modified embodiment of the a-contact fusion switch before and after the operation thereof. FIG. 10(a) shows a state before the operation of the a-contact fusion switch, and FIG. 10(b) shows a state after the operation of the a-contact fusion switch.

In FIG. 10(a), a heating element 421 is inserted into a third electrode 420, and power may be supplied to the heating element 421 through a heating element power supply line 322.

Both sides of the third electrode 420 are plated or coated with a conductive bonding material 420a. An insulative support member 440 is disposed between a first electrode 411 and the third electrode 420 and between a second electrode 412 and the third electrode 420. The insulative support member 440 is formed of a material that is weak to heat but is insulative, and has a lower melting point than the electrodes (the first electrode 411, second electrode 412, and third electrode 420).

The bracket spring 450 is a "bracket-shaped elastic spring" that surrounds the first electrode 411 and the second electrode 412 and provides compressive force. The insulator 450 outside the first electrode 411 and the second electrode 412 serves to prevent the "bracket-shaped elastic spring" from being electrically connected to the first electrode 411 and the second electrode 412 when the "bracket-shaped elastic spring" is formed of a conductive metal. If the bracket spring 450 is formed of a non-conductive material (for example, a plastic material that is non-conductive), the insulator 450 is not required.

When the heating element 421 of the third electrode 420 generates heat in the state of FIG. 10(a), the conductive bonding material 420a and the insulative support member 440 are melted by the heat. That is, the insulative support member 440 melts and disappears, and the conductive bonding material 420a is transformed into a molten state. At this time, if heating of the heating element is stopped with pressing force applied by the bracket spring 450, the conductive bonding material 420a is solidified and the third electrode 420 is fusion-bonded (melted and solidified to be bonded) to the first electrode 411 and the second electrode 412, and thus electrically connected to the first electrode 411 and the second electrode 412 as shown in FIG. 10(b).

While it is illustrated in the embodiment of FIG. 10 that only the third electrode 420 is plated or coated with the conductive bonding material 420a, the first electrode 411 and the second electrode 412 may be plated or coated with the conductive bonding material 420a, or all of the third electrode 420, the first electrode 411 and the second electrode 412 may be plated or coated with the conductive bonding material 420a.

In contrast with the embodiment of FIG. 10, when the third electrode 420 is fixed to the fusible switch housing, and the feed force generation means is configured to separate the first electrode 411 and the second electrode 412 from the third electrode 420, a b-contact fusible switch may be implemented.

A specific embodiment of the b-contact fusible switch is described below.

A b-contact switch refers to "a switch capable of transitioning from an initial closed state of the two electrodes to an open state of the two electrodes" like the first-type switch, and a b-contact fusible switch refers to a fusible switch serving as the b-contact switch.

Figure 11:
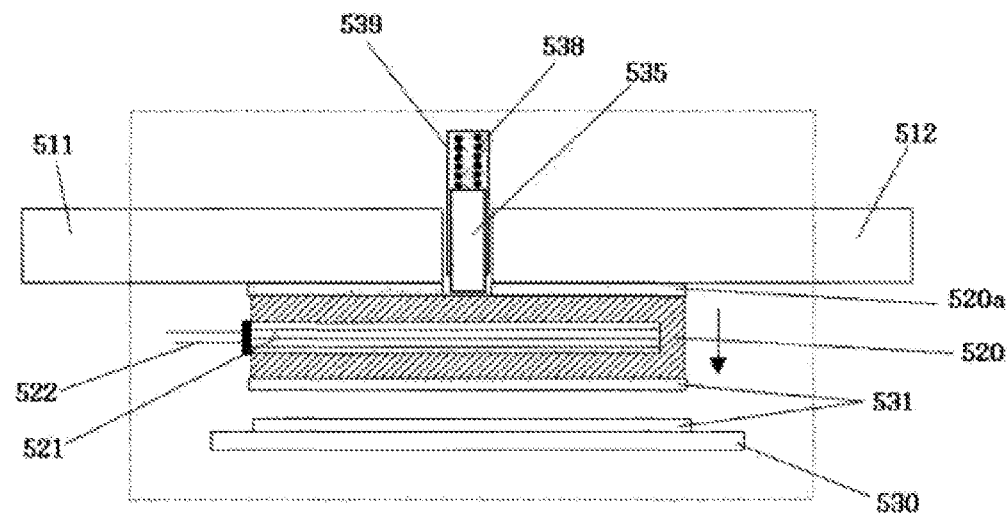
FIG. 11 shows the states of a first embodiment of a b-contact fusible switch before and after the operation thereof.
Figure 11:
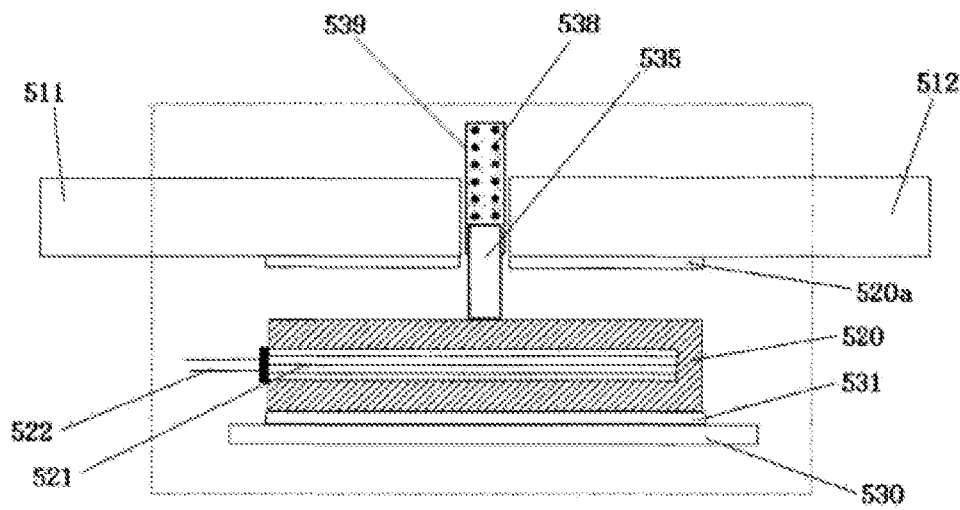

FIG. 11 shows the states of a first embodiment of a b-contact fusible switch before and after the operation thereof.

FIG. 11(a) shows a state before the operation of the b-contact fusible switch, and FIG. 11(b) shows a state after the operation of the b-contact fusible switch.

In FIG. 11(a), a conductive bonding material 520a is fusion-bonded in a soldered state between a moving electrode 520 and two stationary electrodes 511 and 512, and thus the two stationary electrodes 511 and 512 are electrically connected.

The spring 538 and the spring housing 539 constitute a feed force generation means.

The feed force generation means of FIG. 11 generates feed force by the elastic force of the spring 538.

The transfer link 535 serves to transfer the feed force applied by the spring to the moving electrode 520. The transfer link 535 is preferably attached to the moving electrode 520.

Although the feed force generation means of FIG. 11 generates feed force, the moving electrode 520 cannot move because the moving electrode 520 is fixed to the two stationary electrodes 511 and 512 by the conductive bonding material 520a.

A heating element 351 is present inside the moving electrode 520. The heating element 521 of FIG. 11 is an insulated hot wire. The heating element power supply line 522 is used to supply electric power to the heating element.

In FIG. 11(a), when power is supplied to the heating element 521 installed in the moving electrode 520, the temperature of the moving electrode 520 is increased due to heat generated by the heating element 521, and the conductive bonding material 520a on the bonding portions of the moving electrode 520 and the stationary electrodes 511 and 512 reaches the melting point thereof and thus melts. At the same time, the moving electrode 520 is separated from the stationary electrode 511 and 512 and moved by the feed force of the feed force generation means.

Thus, the structure provides a switching function of transitioning from an initial closed state to an open state.

In FIG. 11(b), the hold portion 530 is intended to fix the moving electrode 520 in order to provide durability against external impact. A low-temperature fusible material 531 is present between the moving electrode 520 and the hold portion 530 to fusion-bond the moving electrode 520 and the hold portion 530. The low-temperature fusible material 531 has a melting point lower than the melting points of the moving electrode 520 and the hold portion 530, and may be a conductive material or a non-conductive material.

During the switch operation, the low-temperature fusible material 531 is also melted by the heat of the heating element, and then solidifies after the switch operation is completed, thereby fixing the moving electrode 520 to the hold portion 530.

Even if there is no feed force generation means, the moving electrode 520 can move downward due to gravity. The function of the hold part 530 is important when there is no feed force generation means. If the feed force generation means is provided as shown in FIG. 11, the hold part 530 may be omitted.

Figure 12:
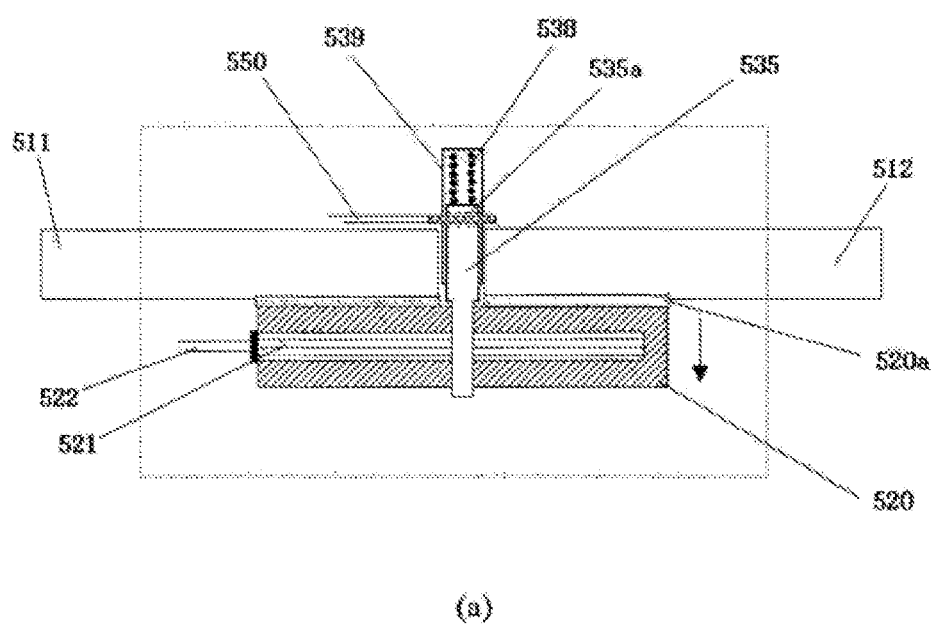
FIG. 12 shows the states of a second embodiment of a b-contact fusible switch before and after the operation thereof.
Figure 12:
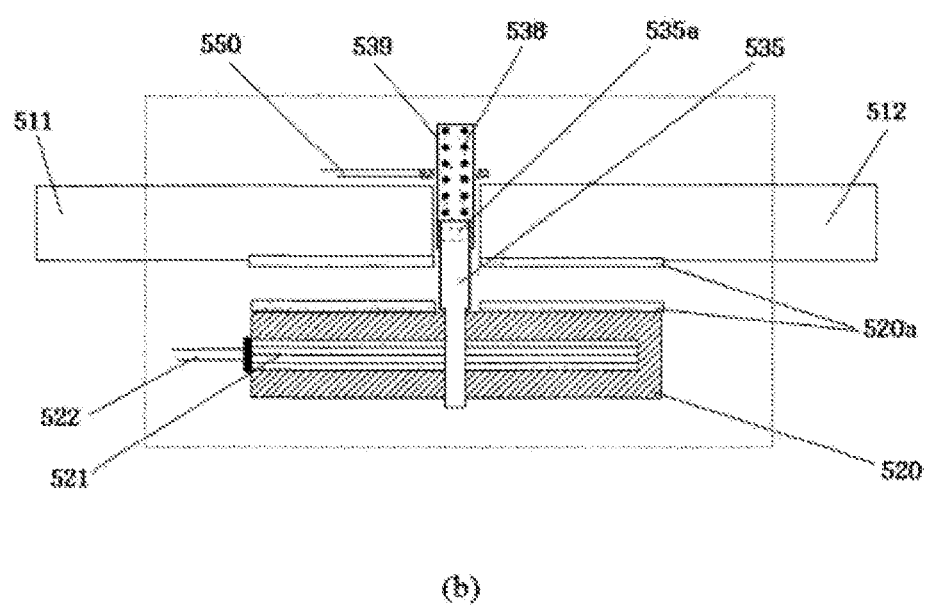

FIG. 12 shows the states of a second embodiment of a b-contact fusible switch before and after the operation thereof.

In FIG. 12, the fuse wire 550 restricts the elastic force of the compression spring 538, thereby blocking the force applied to the moving electrode 520 before the fusible switch operates.

FIG. 12(a) shows a state before the operation of the b-contact fusible switch, and FIG. 12(b) shows a state after the operation of the b-contact fusible switch.

In FIG. 12(a), a conductive bonding material 520a is fusion-bonded between the two stationary electrodes 511 and 512 and the moving electrode 520, and thus the two stationary electrodes 511 and 512 are electrically connected.

The spring 538 and the spring housing 539 constitute a feed force generation means. However, a transfer link hole 535a is formed in the transfer link 535, and a fuse wire 550 is arranged through the transfer link hole 535a to fix the position of the transfer link 535.

During the switch operation, electric current is supplied to the heating element 521 and the fuse wire 550, and the fuse wire melts and breaks so that the elastic force of the constrained compressed spring 538 is transmitted to the moving electrode 520 via the transfer link 535.

The conductive bonding material 520a is also melted by the heat of the heating element 521. Accordingly, the moving electrode 520 is spaced apart from the stationary electrodes 511 and 512, and the two stationary electrodes 511 and 512 are electrically disconnected from each other.

Here, even if the fuse wire 550 for restraining the elastic force of the compression spring 538 is not used, the operation of the b-contact fuse switch is not affected.

Figure 13:
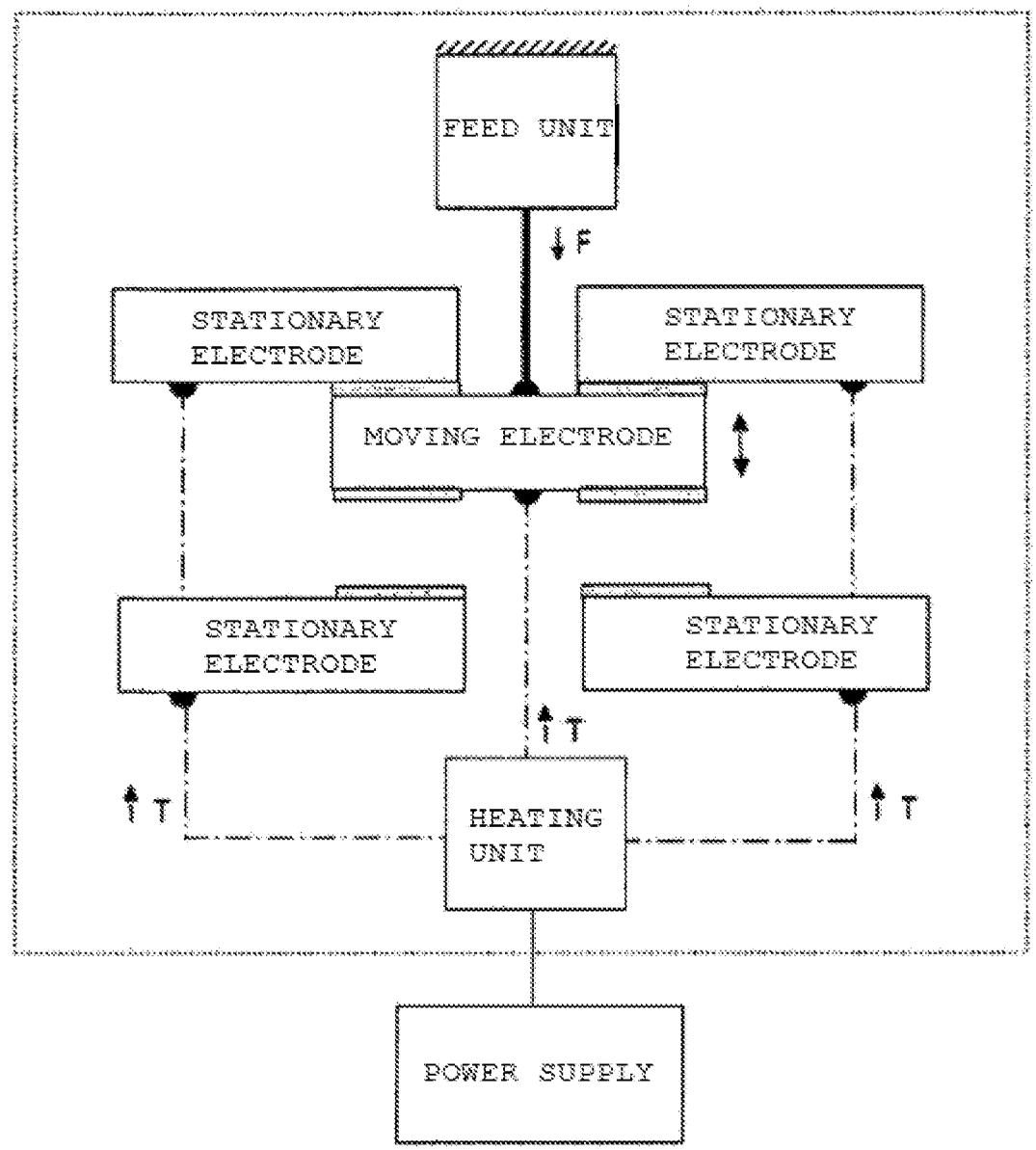
FIG. 13 is a conceptual diagram of a c-contact fusible switch according to the present invention.

FIG. 13 is a conceptual diagram of a c-contact fusible switch (change over contact-fusible switch) according to the present invention.

The c-contact fusible switch refers to a fusible switch serving as a c-contact switch. The "c-contact fusible switch" may be a fusible switch that combines the b-contact fusible switch and the a-contact fusible switch (in terms of functions thereof).

As shown in FIG. 13, the c-contact fusible switch includes two stationary electrodes disposed at an upper portion, two stationary electrodes disposed at a lower portion, a moving electrode configured to move in a vertical direction, a feed unit for providing feed force to the moving electrode to cause the moving electrode to unidirectionally or bidirectionally move, a conductive bonding material (soldering material) for performing fusion bonding in a soldering state or fusible disconnection in a desoldered state between the stationary electrodes and the moving electrode, and a heating unit.

The feed unit may include a means for generating feed force (for example, a spring, a motor, etc.).

The heating unit is a part for supplying heat to melt the conductive bonding material located at the contact point between the stationary electrodes and the moving electrode, and includes a heating element for generating heat. The heating unit may supply heat to all of the moving electrode and the four stationary electrodes, or may supply heat to only a portion of the moving electrode and the four stationary electrodes.

When the heating element is a device that generates heat by electricity, the heating element requires a power supply for supplying electricity. The power supply may supply or cut off power to the heating element.

When the moving electrode moves up to connect the upper two stationary electrodes, the upper two stationary electrodes are electrically connected. When the moving electrode moves down to connect the two lower stationary electrodes, the lower two stationary electrodes are electrically connected. When the moving electrode connects the stationary electrodes, it is fusion-bonded by the conductive bonding material, and thus the resistance between the connected stationary electrodes becomes very low.

A specific embodiment of the c-contact fusible switch is described below.

Figure 14:
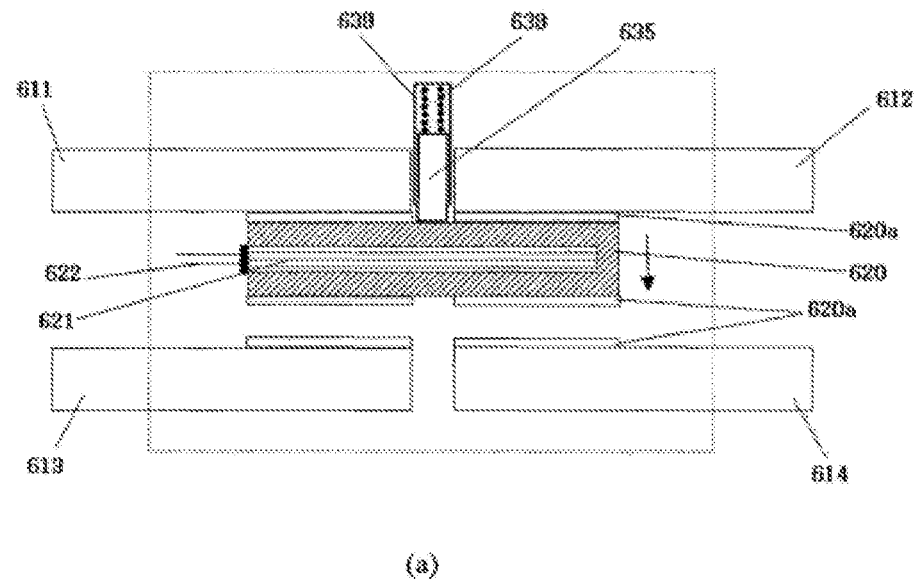
FIG. 14 shows the states of a first embodiment of the c-contact fusible switch before and after the operation thereof.
Figure 14:
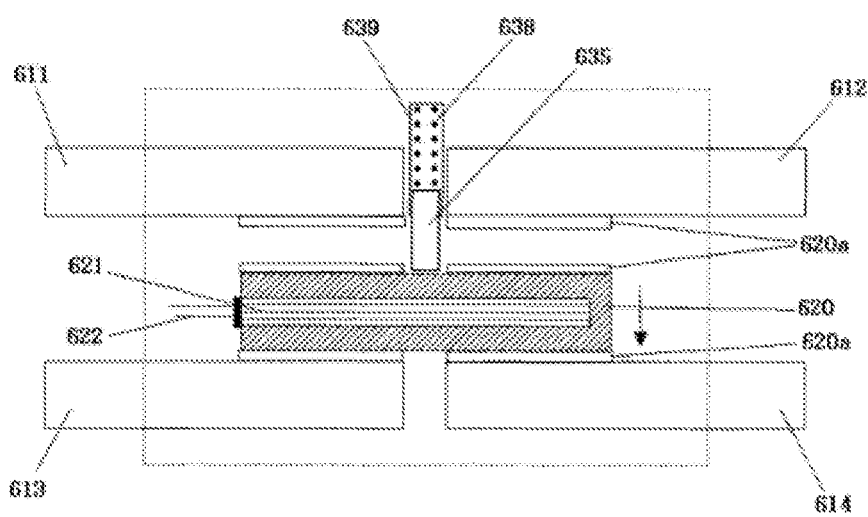

FIG. 14 shows the states of a first embodiment of the c-contact fusible switch before and after the operation thereof.

FIG. 14(a) shows a state before the operation of the c-contact fusible switch, and FIG. 14(b) shows a state after the operation of the c-contact fusion switch.

In FIG. 14, the hold portion 330 of FIG. 6 or the hold portion 530 of FIG. 11 is replaced by a pair of independent stationary electrode side terminals. In this example, a conductive bonding material is required between the substituted stationary electrode side terminals and the moving electrode.

The fusible switch of FIG. 14 opens a first stationary electrode 611 and a second stationary electrode 612 located on the upper side and closes a third stationary electrode 613 and a fourth stationary electrode 614 located on the lower side according to movement of the moving electrode 620, and therefore may perform the same function as the switch of FIG. 4(a).

The moving electrode 620 shown in FIG. 14 moves to a stationary electrode contact portion that is arranged perpendicular to the direction of gravity or feed force (when a feed force generation means is provided) applied to the moving electrode, as in the cases of FIGS. 6 and 11.

A heating element 621 is present inside the moving electrode 620. The heating element 621 of FIG. 14 is an insulated hot wire. The heating element power supply line 622 is used to supply electric power to the heating element.

The spring 638 and the spring housing 639 constitute a feed force generation means.

The feed force generation means of FIG. 14 generates feed force by the elastic force of the spring 638.

The transfer link 635 serves to transfer the feed force applied by the spring to the moving electrode 620. The transfer link 635 is preferably attached to the moving electrode 620.

Although the feed force generation means of FIG. 14 generates feed force, the moving electrode 620 cannot move because the moving electrode 620 is fixed to the first stationary electrode 611 and the second stationary electrode 612 by the conductive bonding material 620a.

In the operation of the switch of FIG. 14, when electric power is supplied to the heating element 621 through the heating element power supply line 622, the conductive bonding material 620a in contact with the moving electrode 620 is melted. As a result, the moving electrode 620 is moved downward by the feed force of the feed force generation means, and is fusion-bonded to the third stationary electrode 611 and the fourth stationary electrode 612 via the conductive bonding material 620a.

If fusion bonding between the stationary electrode and the moving electrode is performed only by the pressure applied by the weight of the moving electrode, the contact pressure for fusion bonding is weakened and the installation direction is limited to the direction of gravity.

In order to overcome these issues, it is preferable to separately provide a feed force generation means for moving the moving electrode rather than solely depending on the weight of the moving electrode in moving the moving electrode.

FIG. 14 illustrates that a compression spring is employed as the feed force generation means of the c-contact fusible switch.

Of course, a motor and an electromagnet which are bidirectional feed force generation means may be used instead of the compression spring.

In the drawings of the above embodiments, the heating element is buried only in the moving electrode. The heating element may be buried in all of the moving electrode and the stationary electrodes in order to melt the conductive bonding material more quickly and shorten the operating time of the fusible switch.

Figure 15:
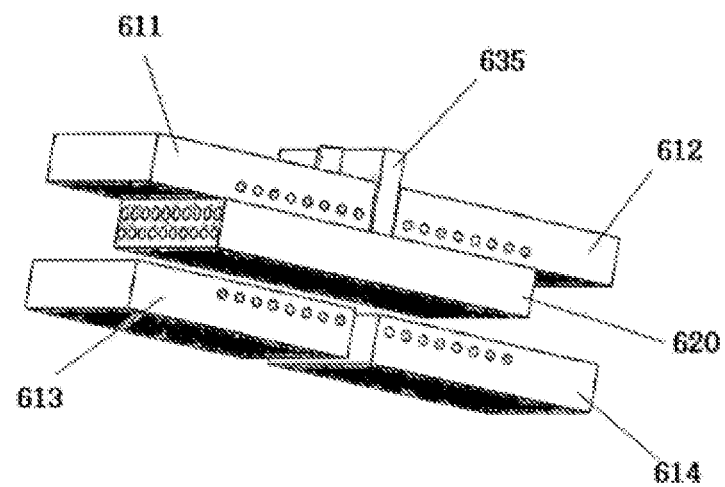
FIG. 15 is a perspective view of a moving electrode and a stationary electrode in a case where a heating element is buried in all of the moving electrode and the stationary electrodes in the first embodiment of the c-contact fusible switch.
Figure 15:
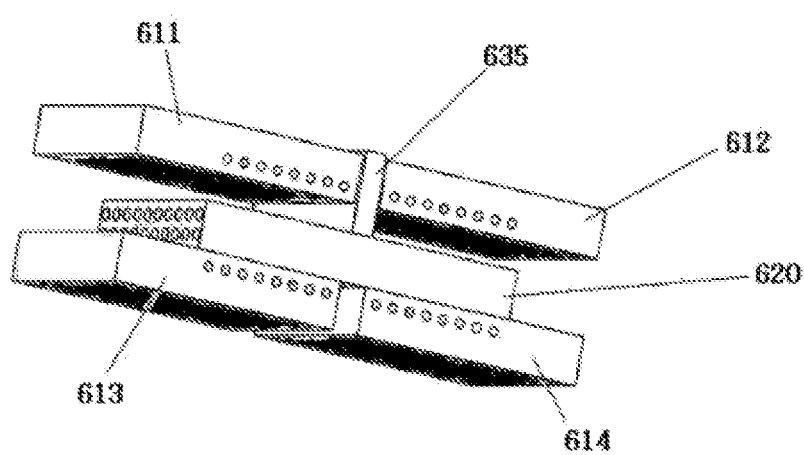

FIG. 15 is a perspective view of a moving electrode and a stationary electrode in a case where a heating element is buried in all of the moving electrode and the stationary electrodes in the first embodiment of the c-contact fusible switch. FIG. 15(a) shows a state before the operation of the c-contact fusible switch, and FIG. 15(b) shows a state after the operation of the c-contact fusible switch.

The moving electrode 620 of FIG. 15 is provided with a plurality of holes for inserting a heating element, and the four stationary electrodes 611, 612, 613, and 614 are also provided with a plurality of holes for inserting a heating element.

The disconnection force and the contact force (contact pressure) applied to the moving electrode during fusion disconnection and fusion bonding are determined by the force generated in the feed force generation unit. Here, when the moving electrode is fusion-bonded to the stationary electrodes with a strong contact force (high contact pressure) applied, the on resistance may be relatively reduced.

The feed force generation means may further include a transfer link, and thus may transfer the force generated by the feed force generation means to the moving electrode via the transfer link.

The transfer link is configured to move across the two stationary electrodes in the moving direction of the moving electrode to provide a function of a partition preventing the two stationary electrodes from being closed due to the molten conductive bonding material having fluidity. Here, the partition preferably has a flat plate shape.

Further, in order to appropriately adjust the amount of the molten conductive bonding material, a discharge channel may be further provided on the wall surface of the housing of the fusible switch.

It is apparent that the transfer link of the present invention is not limited to the above-described embodiment, but may have various shapes depending on the shapes and structures of the feed force generation means, the stationary electrodes, the moving electrode, and the fusible switch.

In addition, a guide groove may be provided such that the moving electrode can accurately move.

Figure 16:
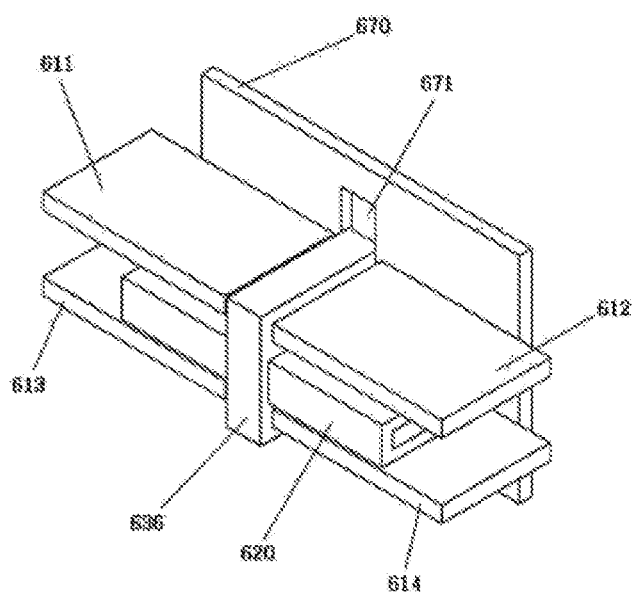
FIG. 16 shows the c-contact fusible switch with a guide groove formed therein.

FIG. 16 shows the c-contact fusible switch with a guide groove formed therein.

In FIG. 16, a guide groove 671 is formed in the fusible switch housing 670, and a partition 636 may move up and down along the guide groove 671. The moving electrode 620 coupled to the partition 636 moves up and down together with the partition 636 and is coupled to the first stationary electrode 611 and the second stationary electrode 612 on the upper side or to the third stationary electrode 613 and the fourth stationary electrode 614 on the lower side.

In the case where the fusible switch is formed into an actual product, it is preferable that all the parts except the stationary electrodes and the power supply line, which are necessarily exposed to the outside, are sealed by the fusible switch housing.

Figure 17:
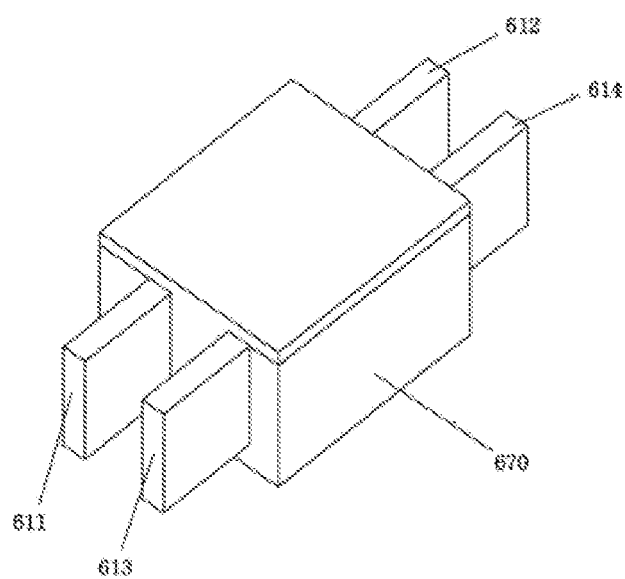
FIG. 17 shows the c-contact fusible switch sealed by a fusible switch housing.

FIG. 17 shows the c-contact fusible switch sealed by a fusible switch housing.

In FIG. 17, the c-contact fusible switch is sealed by the fusible switch housing 670, and only the four stationary electrodes 611, 612, 613 and 614 and the power supply line (not shown) are exposed to the outside.

In FIGS. 6, 8, 9 and 11 to 14, the rectangle (indicated by a dotted line) conceptually represents the housing 680. That is, the rectangle shown in FIGS. 6, 8, 9 and 11 to 14 corresponds to the housing 680, and only a portion of the two stationary electrodes is exposed to the outside of the housing 680.

Figure 18:
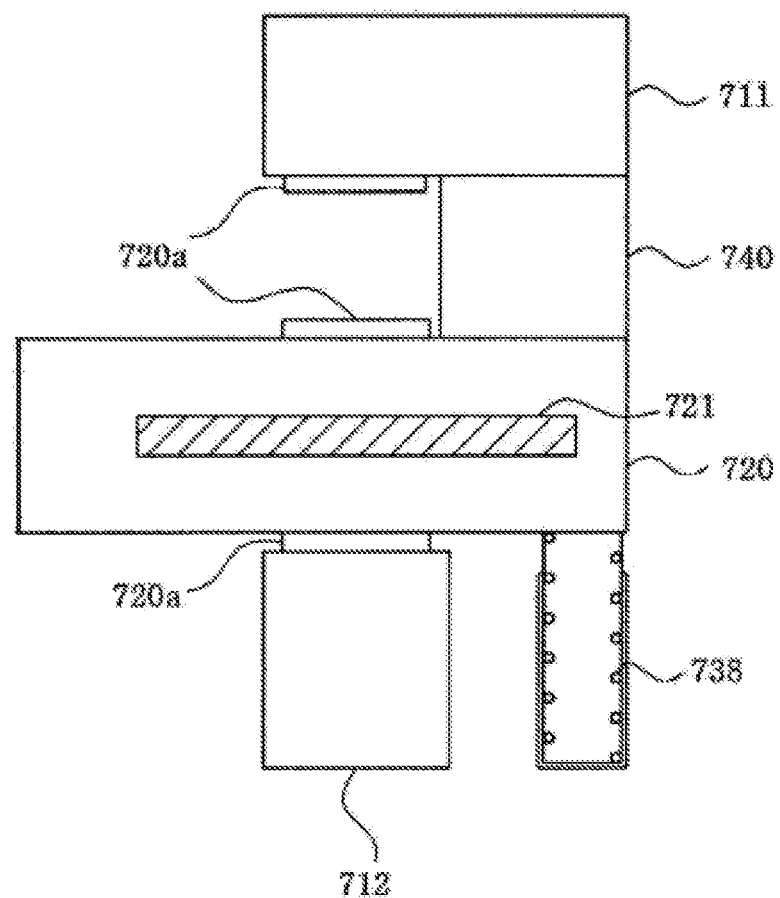
FIG. 18 is a modified embodiment of the c-contact fusible switch.

FIG. 18 is a modified embodiment of the c-contact fusible switch.

The embodiment of FIG. 18 implements the c-contact fusible switch of FIG. 4(b) using an insulative support member 740.

A first stationary electrode 711 and a second stationary electrode 712 are present at fixed positions and a moving electrode 720 is present therebetween. When the moving electrode 720 is bonded to the first stationary electrode 711, the moving electrode 720 and the first stationary electrode 711 are electrically connected. When the moving electrode 720 is bonded to the second stationary electrode 712, the moving electrode 720 and the second stationary electrode 712 are electrically connected.

Since the moving electrode 720 should move up or down and be connected to an electric wire, it must be connected to a stranded cable or be formed as an electrode that is slightly elastic.

The insulative support member 740 should be formed of a material that is weak to heat but has a persistent support capability, such as flux for soldering or styrofoam. That is, the insulative support member must have a lower melting point than the electrodes contacting the insulative support member.

The compression spring 738 generates feed force to move the moving electrode 720 upward, while the insulative support member 740 blocks movement of the moving electrode 720 and the moving electrode 720 is coupled with the second stationary electrode 712 via the conductive bonding material 720a. Therefore, the moving electrode 720 maintains electrical coupling with the second stationary electrode 712.

However, when the heating element 721 generates heat, the insulative support member 740 and the conductive bonding material 720a are melted. Thereby, the moving electrode 720 moves upward and is coupled with the first stationary electrode 711. When heating of the heating element is stopped and thus the moving electrode 720 is cooled, the moving electrode 720 and the first stationary electrode 711 are fusion-bonded through the conductive bonding material 720a, and thus the moving electrode 720 maintains electrical coupling with the stationary electrode 711.

If an electric insulator (non-conductive material) is placed "between the insulative support member and the first stationary electrode" or "between the insulative support member and the moving electrode" in the fusible switch of FIG. 18, "the insulative support member" can be changed to an "electrically conductive support member."

The support member may be replaced with other support means such as a fuse wire.

The compression spring 738 may be replaced with another feed force generation means.

The insulative support member 340 of FIG. 8, the fuse wire 350 of FIG. 9, the fuse wire 550 of FIG. 12, and the insulative support member 740 of FIG. 18 are a type of feed restraining means for suppressing the feed force for the moving electrode. The feed restraining means can be implemented using various other methods. For example, a protrusion movable only in a direction perpendicular to the movement direction of the moving electrode may be inserted into the side surface of the moving electrode to prohibit movement of the moving electrode, and allow the moving electrode to move by moving in a direction in which the protrusion is pulled out of the side surface of the moving electrode. Such feed restraining means may be used for all of the a-contact switch, the b-contact switch and the c-contact switch.

When two electrodes are fusion-bonded through a conductive bonding material, the conductive bonding material may flow downward.

Figure 19:
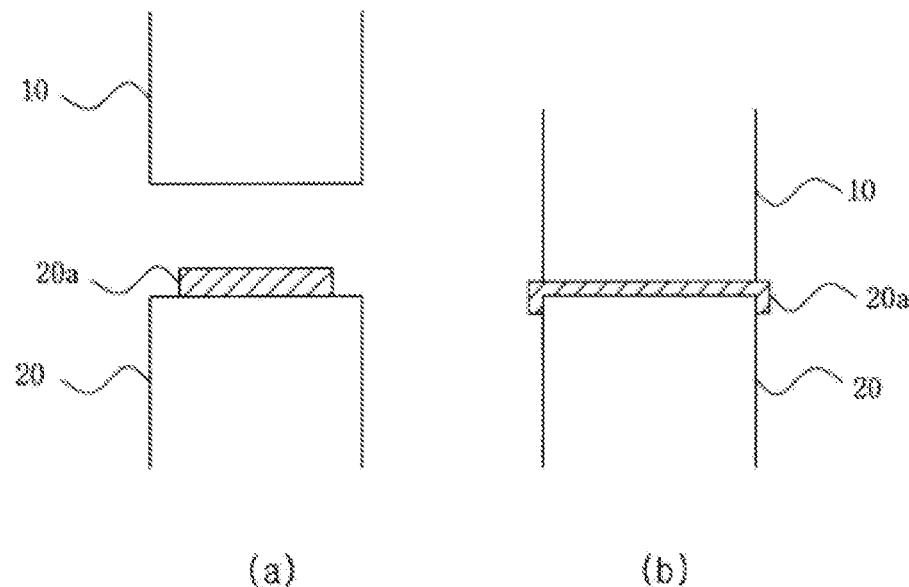
FIG. 19 illustrates a conductive bonding material that is flowing down.

FIG. 19 illustrates a conductive bonding material that is flowing downward.

FIG. 19(a) shows a state before an upper electrode 10 and a lower electrode 20 are fusion-bonded. FIG. 19(b) shows a state after the upper electrode 10 and the lower electrode 20 are fusion-bonded.

Here, the upper side and the lower side are determined by the direction of gravity. That is, the direction in which gravity acts corresponds to the lower side.

When the gap between the upper electrode 10 and the lower electrode 20 is narrowed, a molten conductive bonding material 20a is pushed out to the side by the pressure, and the pushed conductive bonding material 20a flows downward due to gravity.

When the conductive bonding material 20a is melted with the upper electrode 10 and the lower electrode 20 inclined as shown in FIG. 19(a), the conductive bonding material 20a may flow to the side. This is also true when the electrodes are plated or coated with the conductive bonding material 20a.

If a groove is formed in the electrode located at the lower side (on which gravity acts), flow of the molten conductive bonding material to the side may be minimized.

The groove is preferably formed along the rim of the fusion bonding portion of the lower electrode.

Figure 20:
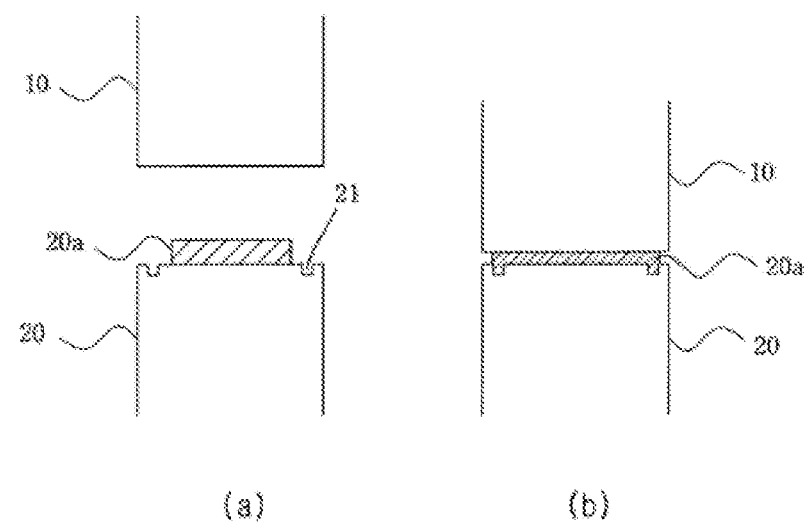
FIG. 20 illustrates an embodiment of forming a groove in a lower electrode.

FIG. 20 illustrates an embodiment of forming a groove in a lower electrode.

FIG. 20(a) shows a state before an upper electrode 10 and a lower electrode 20 are fusion-bonded. FIG. 20(b) shows a state after the upper electrode 10 and the lower electrode 20 are fusion-bonded.

In the lower electrode 20 of FIG. 20, a groove 21 is formed along the rim of the fusion bonding portion.

In FIG. 20(b), since the conductive bonding material 20a is gathered in the groove 21, it may not overflow or the amount of the conductive adhesive material 20a that overflows may be minimized.

Figure 21:
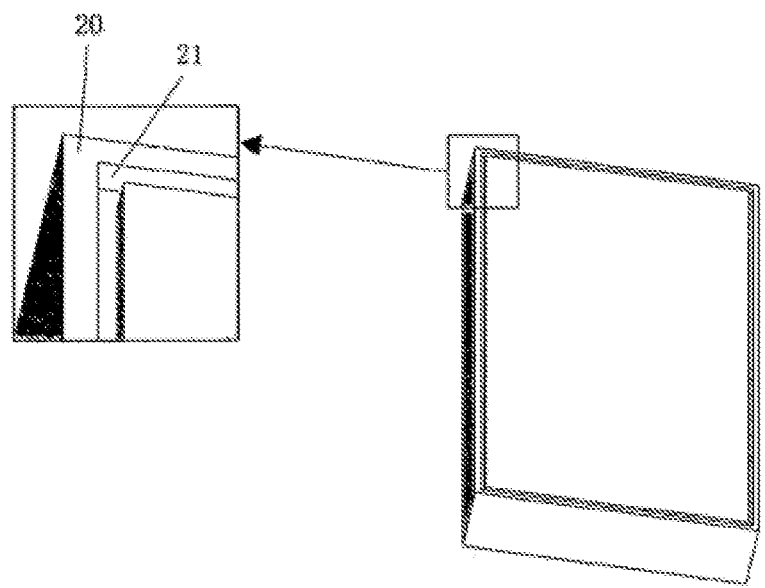
FIG. 21 is an exemplary perspective view of a lower electrode having a groove formed therein.

FIG. 21 is an exemplary perspective view of a lower electrode having a groove formed therein.

In order to prevent the molten conductive bonding material from flowing to the side and downward, a concave portion may be provided to the electrode located on the lower side (on which gravity acts).

Figure 22:
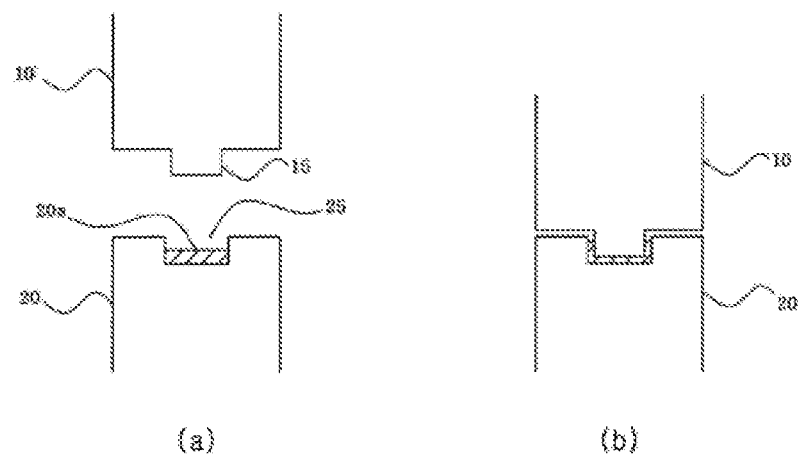
FIG. 22 shows Embodiment 1 having a concave portion.

FIG. 22 shows Embodiment 1 having a concave portion.

FIG. 22(a) shows a state before two electrodes contact each other, and FIG. 22(b) shows a state after the two electrodes contact each other.

The lower electrode 20 is provided with a concave portion 25 to accommodate the conductive bonding material 20a.

The upper electrode 10 is provided with a convex portion 15, whose shape corresponds to the shape of the concave portion 25 of the lower electrode 20. Accordingly, the convex portion 15 of the upper electrode 10 may be brought into close contact with the concave portion 25 of the lower electrode 20.

Figure 23:
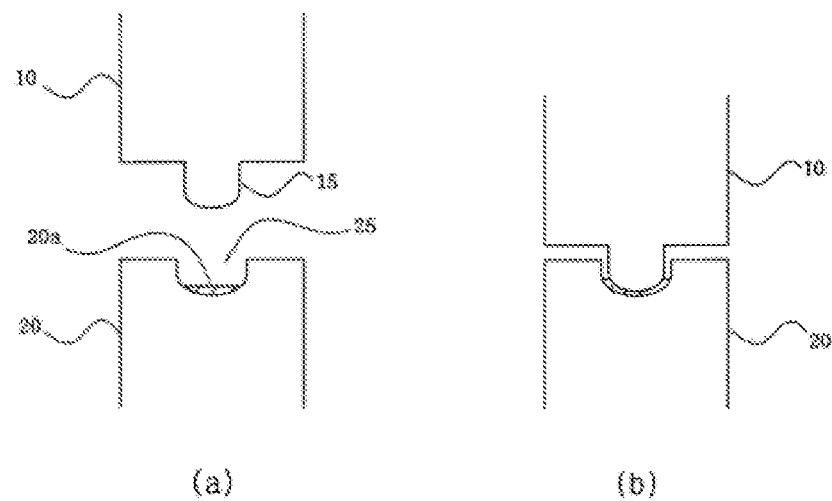
FIG. 23 shows Embodiment 2 having a concave portion.

FIG. 23 shows Embodiment 2 having a concave portion.

FIG. 23(a) shows a state before two electrodes contact each other, and FIG. 23(b) shows a state after the two electrodes contact each other.

The lower electrode 20 is provided with a concave portion 25 to accommodate the conductive bonding material 20a.

The upper electrode 10 is provided with a convex portion 15, whose shape corresponds to the shape of the concave portion 25 of the lower electrode 20. Accordingly, the convex portion 15 of the upper electrode 10 may be brought into close contact with the concave portion 25 of the lower electrode 20.

While the concave portion of the lower electrode and the convex portion of the upper electrode in FIG. 22 have a polyhedral shape, the concave portion of the lower electrode and the convex portion of the upper electrode in FIG. 23 have a curved shape.

In the embodiments shown in FIGS. 22 and 23, the concave portion and the convex portion are substantially the same in shape and size. However, if the convex portion is made slightly smaller than the concave portion or the shape of the convex portion is partially cut out to create an internal space, the molten conductive bonding material may be positioned in the empty space, and therefore this shape is more advantageous in preventing the conductive bonding material from being pushed out to the side.

In addition, when the depth of the concave portion is increased, the molten conductive bonding material 20a is not prevented from flowing to the side even if the fusible switch is inclined.

Figure 24:
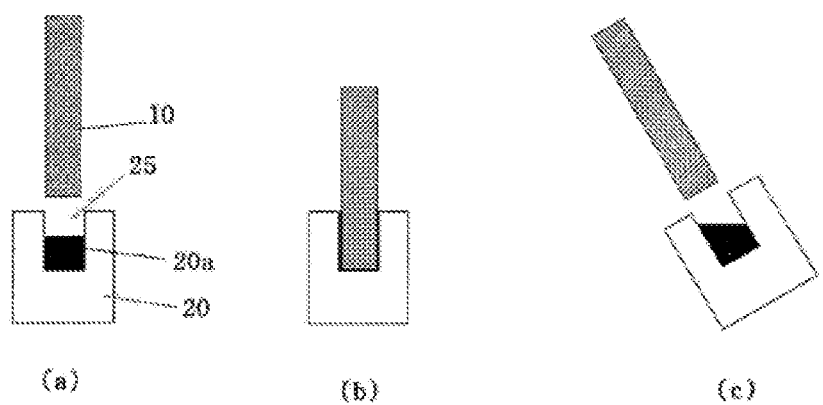
FIG. 24 shows Embodiment 3 having a concave portion.

FIG. 24 shows Embodiment 3 having a concave portion.

FIG. 24(a) shows a state before two electrodes contact each other, and FIG. 24(b) shows a state after the two electrodes contact each other, FIG. 24(c) shows the two electrodes tilted before contacting each other.

If a concave portion is formed in the lower electrode, loss of the conductive bonding material may be minimized because the conductive bonding material does not leak to the outside even if the fusible switch is repeatedly operated several times, which is advantageous in producing a repetitive fusible switch.

The shape and size of the concave portion may be variously modified as needed.

However, in order for the fusible switch to repeatedly perform the switching operation instead of performing the switching operation once, it is necessary to continuously provide a conductive bonding material required to repeatedly perform fusion bonding and fusion disconnection, and the feed force generations means should be capable of generating feed force in both directions, not in one direction. A typical example of a means capable of generating feed force in both directions is a motor. The moving electrode is coupled to a feed screw that converts rotational motion of the motor into rectilinear motion, and thus receives the feed force in both directions.

Figure 25:
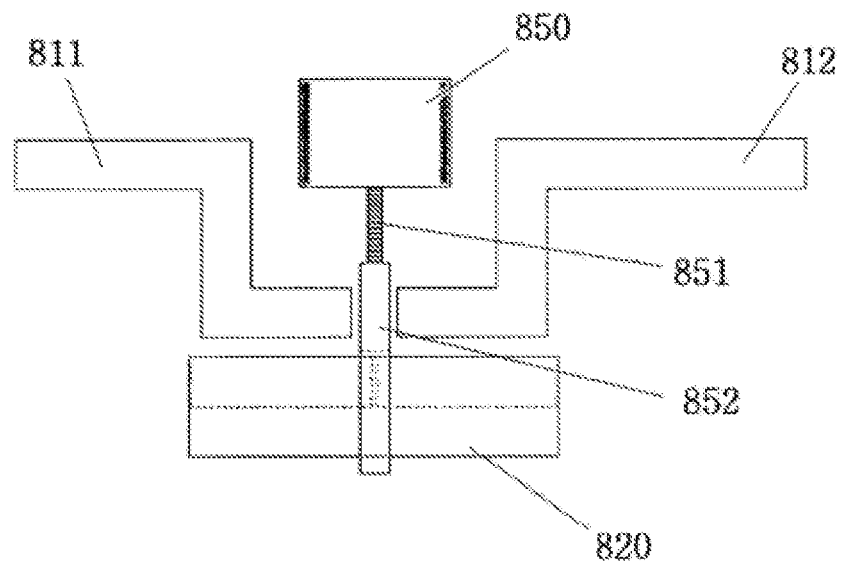
FIG. 25 shows an embodiment of a repetitive fusible switch.
Figure 25:
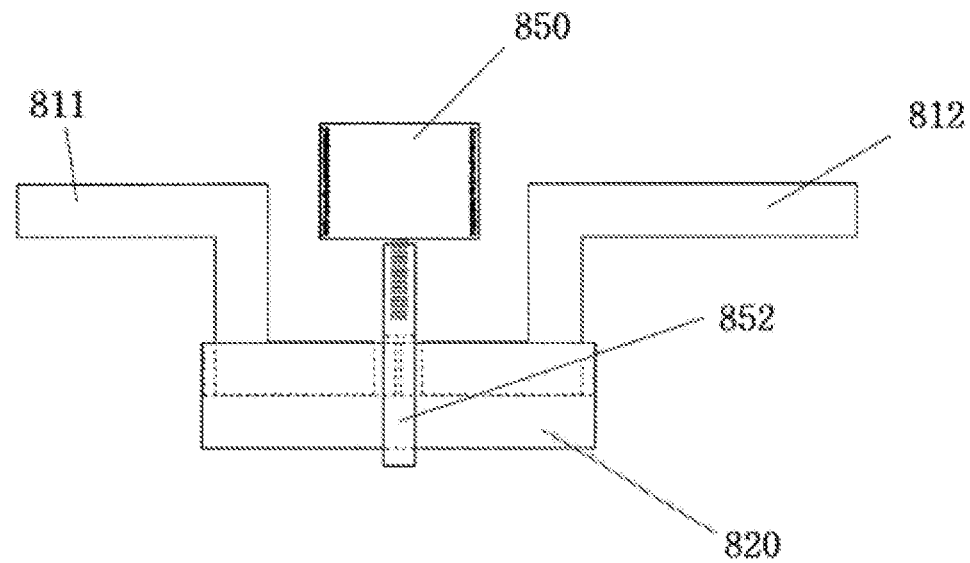

FIG. 25 shows an embodiment of a repetitive fusible switch.

FIG. 25(a) shows a state in which a repetitive fusible switch is open, and FIG. 25(b) shows a state in which the repetitive fusible switch is closed.

A moving electrode 820 is arranged below two spaced stationary electrodes 811 and 812. The moving electrode 820 can move up and down by the rotation torque of the motor 850. A feed screw 851 is connected to the motor and threads having a shape corresponding to the feed screw 851 are formed on a transfer link 852. Accordingly, the transfer link 852 is moved up and down as the motor rotates.

The transfer link 852 is coupled to the moving electrode 820.

Here, since the feed position of the moving electrode 820 can be controlled by the motor 850, the moving electrode may be sufficiently preheated and then brought into contact with the stationary electrodes to perform fusion bonding.

As shown in FIG. 25(*a*), when the moving electrode 820 is spaced apart from the two stationary electrodes 811 and 812, the two stationary electrodes 811 and 812 are electrically separated from each other. As shown in FIG. 25(*b*), when the moving electrode 820 is coupled to the two stationary electrodes 811 and 812, the two stationary electrodes 811 and 812 are electrically connected.

Figure 26:
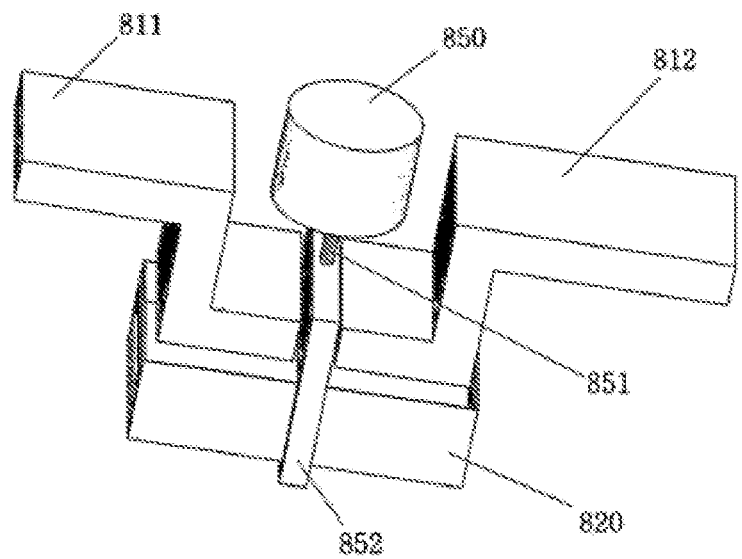
FIG. 26 is a perspective view of the repetitive fusible switch of FIG. 25.

FIG. 26 is a perspective view of the repetitive fusible switch of FIG. 25.

Figure 27:
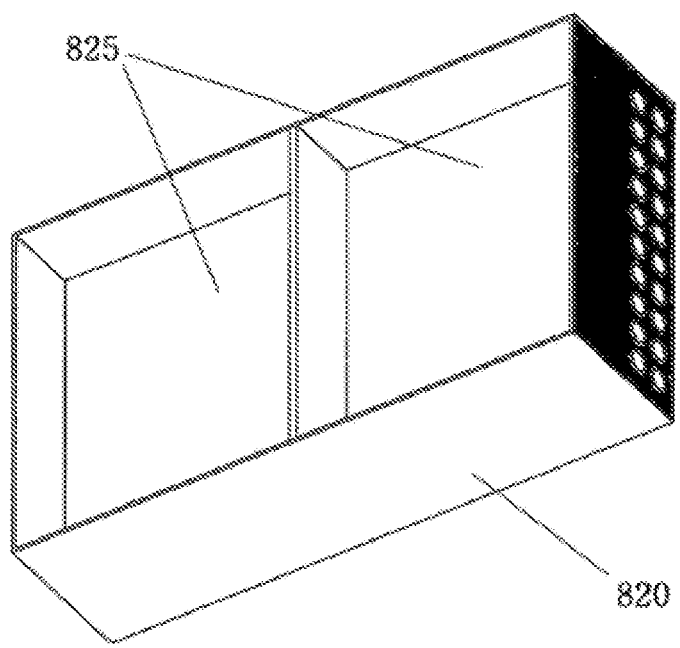
FIG. 27 is a perspective view of the moving electrode of the repetitive fusible switch of FIG. 25.

FIG. 27 is a perspective view of the moving electrode of the repetitive fusible switch of FIG. 25.

Two concave portions 825 are formed in the upper portion of the moving electrode 820, and thus the conductive bonding material may be positioned therein. A plurality of holes for inserting a heating element is formed in the lower portion of the moving electrode 820.

Preferably, the fusible switch of the present invention further includes an arc preventing means for suppressing generation of arc due to the on-current during fusion disconnection and fusion bonding.

Figure 28:
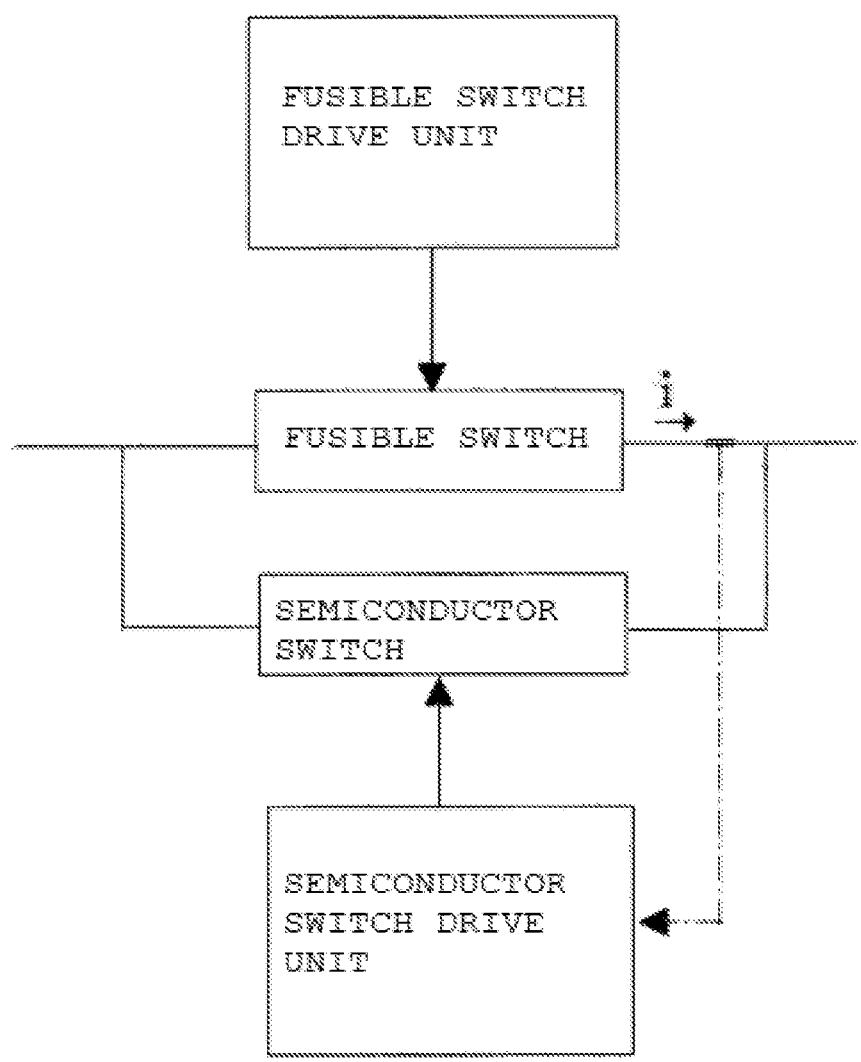
FIG. 28 is a block diagram of an arc prevention device for a fusible switch.

FIG. 28 is a block diagram of an arc prevention device for a fusible switch.

A fusible switch drive unit is a device for driving the fusible switch. The fusible switch drive unit may basically include a heating element power supply functioning to provide and cut off power to the heating element, and a feed controller for moving the moving electrode by driving the motor.

Semiconductor switches (e.g., a transistor, a MOSFET, an IGBT, an SCR, a Triac, etc.) are connected in parallel to the fusible switch.

A semiconductor switch drive unit is a device for driving the semiconductor switches.

The semiconductor switch may be turned on immediately before the fusible switch is fusion-disconnected, and may be turned off after fusion disconnection is completed to suppress arc generation.

That is, during fusion disconnection, the semiconductor switch provides the path of on-current, and after the fusion disconnection is completed, flow of the on-current by the semiconductor switch is blocked.

In order to minimize the on time of the semiconductor switch, it is more preferable to turn on the semiconductor switch immediately before the current of the fusible switch is cut off.

Here, in order to minimize the on time of the semiconductor switch, the semiconductor switch drive unit includes a current detection means for detecting current flowing through the fusible switch to determine whether the value of current flowing through the fusible switch has reached a target value. If the current reaches the target value, the semiconductor switch drive unit may recognize that fusion disconnection or fusion boding has been completed, and turn off the semiconductor switch (The target value of the current is 0 when the fusible switch is opened. When the switch is closed, the current value given when the switch is closed becomes the target value of the current).

The state of completion of fusion disconnection may be determined by a moving electrode position detection means in place of the current detection means.

Here, the moving electrode position detection means may be implemented using various methods.

For example, a micro-switch that operates by contacting the moving electrode at a feed completion position of the moving electrode may be used.

In addition, in order to minimize the on time of the semiconductor switch, the on/off times of the semiconductor switch may be determined on the basis of the actual time required for fusion disconnection and fusion bonding of the fusible switch.

In order to minimize the on time of the semiconductor switch, the semiconductor switch is preferably turned on immediately before the current of the fusible switch is cut off. This may be estimated from the time when electricity is supplied to the heating element of the fusible switch. For example, if the conductive bonding material begins to melt about 10 seconds after electricity is supplied to the heating element at room temperature, it may be estimated that melting has started at a time of about 10 seconds, and thus the semiconductor switch may be turned on at a time around 9 seconds. If the temperature of the fusible switch is known by using a temperature sensor, the temperature at which the conductive bonding material melts may be more accurately estimated.

Figure 29:
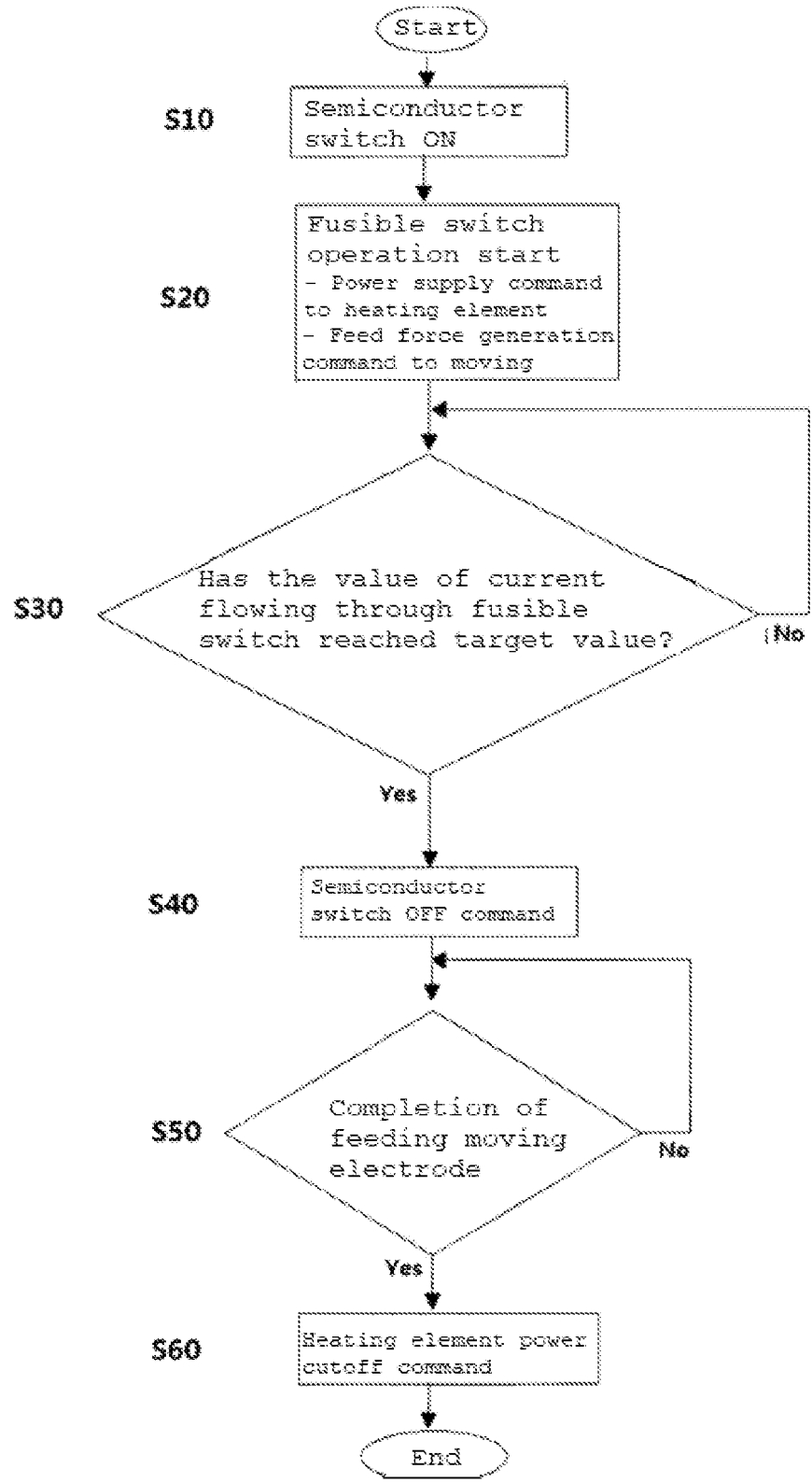
FIG. 29 shows an exemplary flowchart of an arc prevention method for a fusible switch.

FIG. 29 shows an exemplary flowchart of an arc prevention method for a fusible switch.

First, when the fusible switch operation is started, a semiconductor switch-on command is issued in step S10.

In step S20, a fusible switch operation start command is issued. The fusible switch operation start command includes a power supply command to be issued to the heating element and a feed force generation command to the moving electrode.

In step S30, it is checked whether fusion disconnection or fusion bonding has been completed. It is determined whether the value of current flowing through the fusible switch has reached a target value. If the current value reaches the target value, the process proceeds to the next step (The target value of the current is 0 when the fusible switch is opened (for fusion disconnection). When the switch is closed (for fusion bonding), the current value given when the switch is closed becomes the target value of the current).

In step S40, a semiconductor switch off command is issued.

In step S50, it is determined whether or not feed of the moving electrode has been completed. If feed of the moving electrode is completed, the process proceeds to the next step.

As an example of the method of determining whether or not feed of the moving electrode has been completed, it is determined that feed of the moving electrode has been completed when a predetermined time (for example, 3 seconds) elapses after the current reaches the target value, or by position detection of the moving electrode and a motor driving current.

In step S60, a command to cut off power supplied to the heating element is issued.

Upon completing all the above steps, operation of the fusible switch is completed.

In FIG. 29, the fusible switch operation start command is issued after the semiconductor switch-on command is issued. Alternatively, in order to minimize the on time of the semiconductor switch, the semiconductor switch-on command may be issued a predetermined time after the fusible switch operation start command is issued.

When the current reaches the value of current flowing through the fusible switch, it is determined that fusion disconnection is completed, and a semiconductor switch-off command and a heating element operation termination command (heating element power cutoff command) may be simultaneously issued.

The fusible switches described above are characterized in that "the on resistance is reduced by fusion-bonding the two stationary electrodes and the moving electrode, which are inevitably present in the switch, with a conductive bonding material." The fusible switch may be modified and implemented in various ways.

In the above embodiments, the conductive bonding material is provided by plating or coating the stationary electrodes and the moving electrode in advance. However, in order to provide a sufficient amount of conductive bonding material, an additional non-melted conductive bonding material may be placed between the stationary electrodes and the moving electrode. For example, the conductive bonding material may be attached to the stationary electrodes or the moving electrode by being combined with an insulative support member which is weak to heat, or may be insulatively coated on a soldering catalyst (for example, a flux-metal oxide coating inhibitor) so as to be attached to the stationary electrodes or the moving electrode.

The fusible switch of the present invention requires a heating element. However, if the amount of current flowing between the two stationary electrodes is sufficient, the heating element may be omitted from the a-contact fusible switch.

Figure 30:
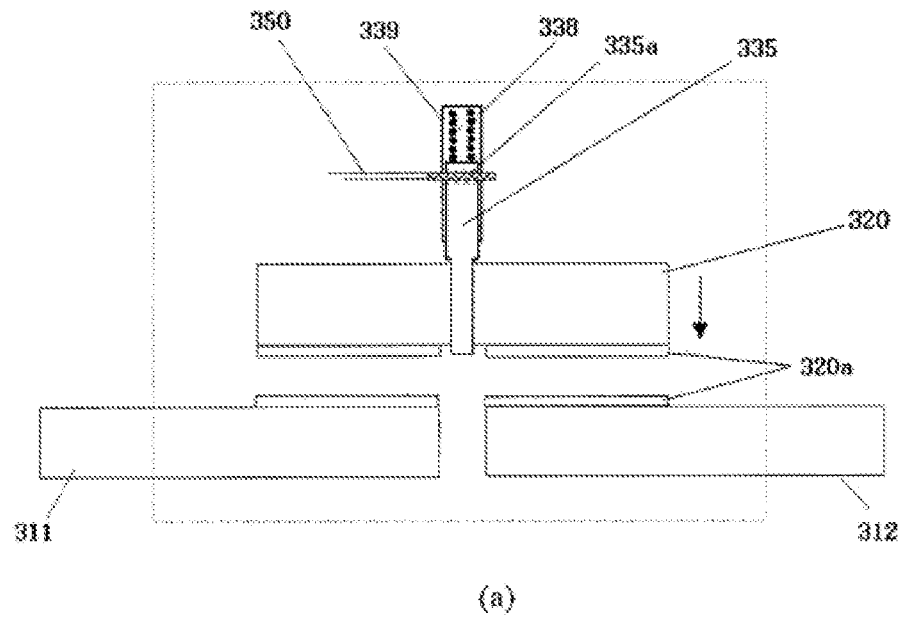
FIG. 30 shows a fusible switch with a heating element 321 removed from the embodiment of FIG. 9.
Figure 30:
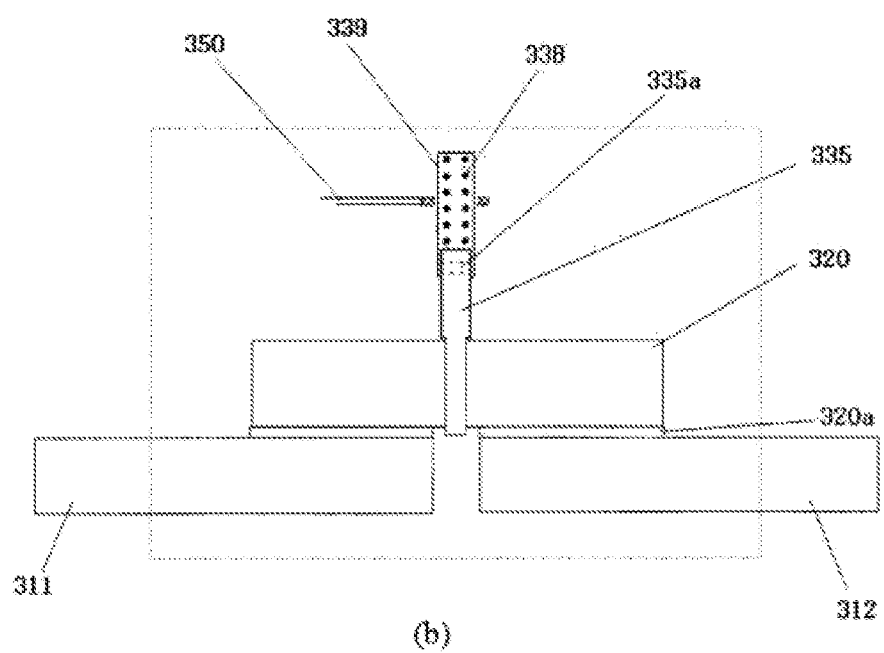

FIG. 30 shows a fusible switch with a heating element 321 removed from the embodiment of FIG. 9.

FIG. 30(a) shows a state before the operation of the fusible switch, and FIG. 30(b) shows a state after the operation of the fusible switch.

When the switch operates, current is supplied to the fuse wire 350, and the fuse wire melts and breaks. Thereby, the elastic force of the constrained compressed spring 338 is transmitted to the moving electrode 320 through the transfer link 335.

When the moving electrode 320 contacts the two stationary electrodes 311 and 312 and the amount of current flowing between the two stationary electrodes is sufficient, the conductive bonding material 320a is melted by Joule heat. After the conductive bonding material 320a is melted, resistance is reduced, and thus the conductive bonding material 320a is solidified while the moving electrode 320 is fusion-bonded to the two stationary electrodes 311 and 312. As a result, the two stationary electrodes 311 and 312 are electrically connected.

In other words, when the moving electrode 320 moves to contact the two stationary electrodes 311 and 312 while an open voltage allowing on-current to flow through both ends of the two stationary electrodes 311 and 312 is applied, the on-current flows between the two stationary electrodes 311 and 312 via the moving electrode 320, and the conductive bonding material 320a is melted by Joule heat of the on-current. Then, when the on resistance between the two stationary electrodes 311 and 312 is reduced, the conductive bonding material is solidified. As a result, the two stationary electrodes 311 and 312 are electrically connected.

Briefly, when the moving electrode contacts two stationary electrodes, the conductive bonding material is fusion-bonded by the Joule heat of electric current flowing between the moving electrode and the two stationary electrodes.

In the above embodiments, all the stationary electrodes are shown as having a uniform thickness. However, in order to minimize temperature rise of the stationary electrode side terminals and shorten the operating time, the thickness of the contacts of the stationary electrode and the thickness of the electrode side terminals may be different from each other so as to have different heat capacities.

Figure 31:
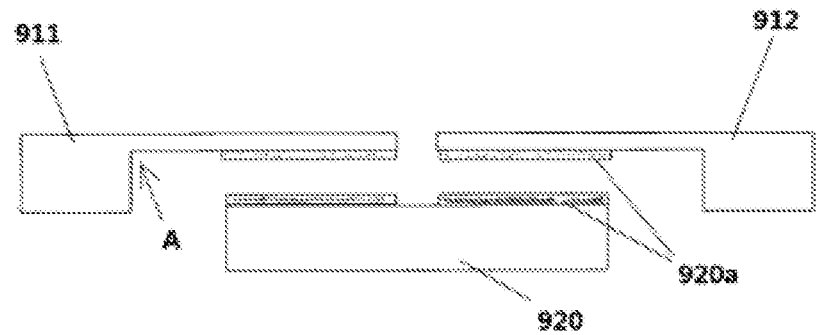
FIG. 31 illustrates change in the thickness of stationary electrodes.
Figure 31:
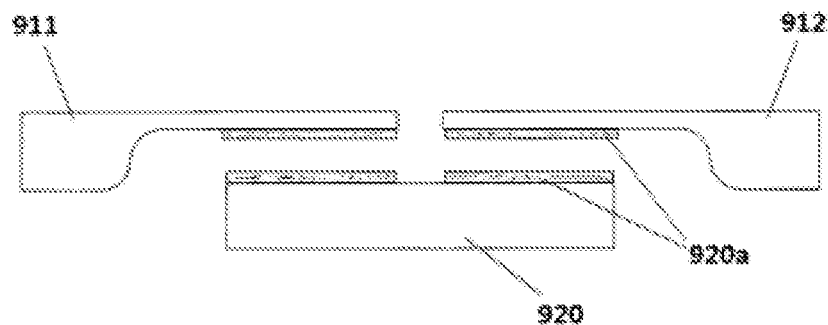
Figure 31:
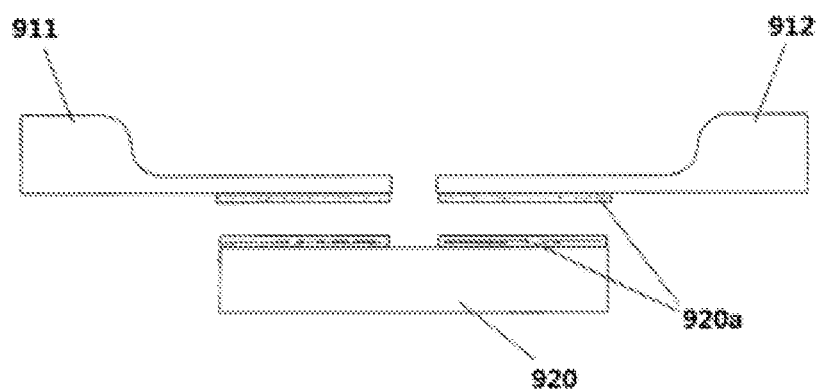

FIG. 31 illustrates change of the thickness of stationary electrodes. FIG. 31(a) is Embodiment 1 of change of the thickness of the stationary electrodes, FIG. 31(b) is Embodiment 2 of change of the thickness of the stationary electrodes, and FIG. 31(c) is Embodiment 3 of change of the thickness of the stationary electrodes.

In FIG. 31(a), two stationary electrodes 911 and 912 are coupled to a moving electrode 920 by a conductive bonding material 920a. A portion of the two stationary electrodes that contacts the moving electrode 920 is formed to be thin.

If the portion of the two stationary electrodes that contacts the moving electrode 920 is formed to be thin, the heat capacity is smaller than that of the thick electrode side terminals of the stationary electrodes, and accordingly the contact of the moving electrode 920 may be heated quickly, which may shorten the operating time for fusion bonding and fusion disconnection.

As shown in FIG. 31(a), if portion A of the thinned portion is angled, flow of current may be concentrated on portion A, and thus portion A may be locally overheated.

Therefore, as shown in FIG. 31(b) or 31(c), it is preferable to form the thin portion into a shape that does not have any angled edge such that the flow of current is not concentrated on the thin portion.

While the moving electrode in the above embodiments is linearly moved so as to be parallel to the stationary electrodes, it may be moved in other manners.

For example, it may perform rotational movement.

Figure 32:
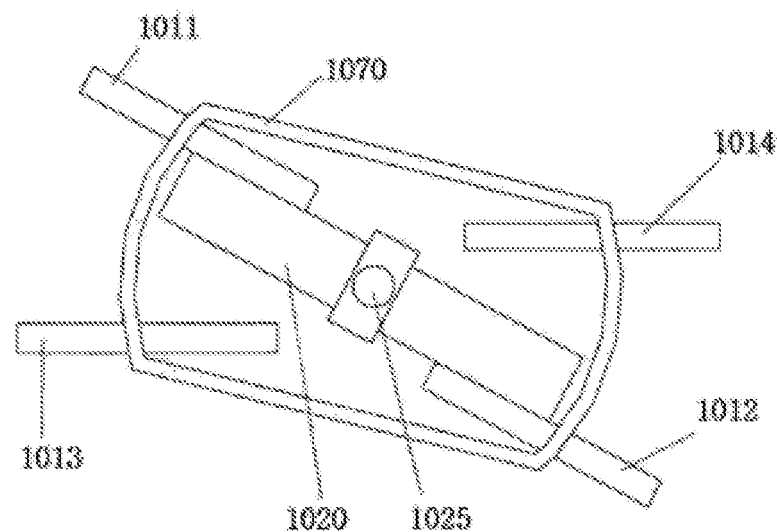
FIG. 32 shows an example of a c-contact fusible switch having a rotatable moving electrode.

FIG. 32 shows an example of a c-contact fusible switch having a rotatable moving electrode.

A moving electrode 1020 capable of rotating about a moving electrode shaft 1025 is provided inside the fusible switch housing 1070.

The moving electrode 1020 may contact a first stationary electrode 1011 and a second stationary electrode 1012 and may rotate and contact a third stationary electrode 1013 and a fourth stationary electrode 1014. When the moving electrode 1020 contacts the stationary electrodes, it is fusion-bonded to a conductive bonding material.

A feed force generation means for rotating the moving electrode 1020 may be implemented by various means. For example, rotational feed force may be generated using a torsional spring, a motor, or the like.

If the third stationary electrode 1013 and the fourth stationary electrode 1014 are removed from the embodiment of FIG. 32, the fusible switch may be used as an a-contact fusible switch or a b-contact fusible switch.

The fusible switch of the present invention is provided with a heating element and thus switch on/off control may be performed independently of the on-current. However, in performing fusion bonding and fusion disconnection while the on-current of the switch flows, Joule heat is generated by the contact resistance of the contacts.

Therefore, when the heat generated by the heating element and the Joule heat generated in the process of contacting/disconnecting from the stationary electrodes are added, the temperature of the contacts rapidly increases, and thus the time for fusion bonding and fusion disconnection is shortened.

When the fusible switch of the present invention is used as a switch of the battery control apparatus of FIGS. 1 to 3, generating high Joule heat requires increase of the contact resistance of the contacts in the contact/disconnection process. This is because the resistance value of one fusible switch is so small that it can be assumed that the amount of current is almost constant, and in the case of constant current, the greater the resistance value, the larger the Joule heat.

Since the contact resistance decreases as the contact pressure of the contacting electrode increases, the contact resistance may be controlled by controlling the contact pressure by adjusting the feed force generated by the feed force generation means.

Further, the contact resistance decreases as the contact area increases. Accordingly, the contact resistance may be increased by reducing the contact area by forming bumps and depressions on a part or the entirety of the surface of the conductive bonding material.

Figure 33:
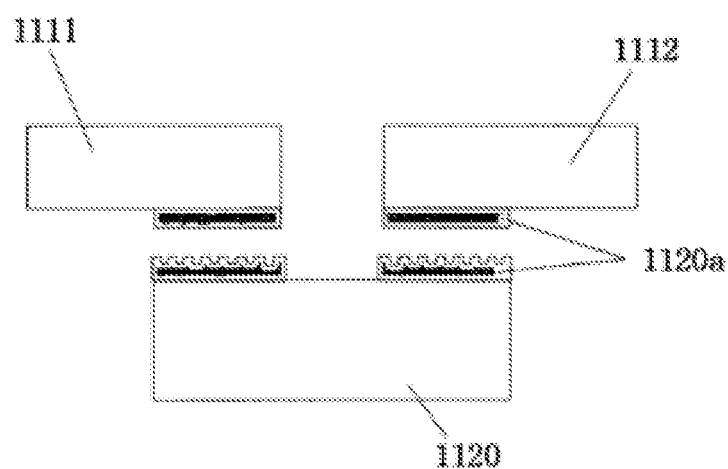
FIG. 33 shows bumps and depressions formed in a part of a contacting conductive bonding material.

FIG. 33 shows bumps and depressions formed in a part of a contacting conductive bonding material.

Figure 34:
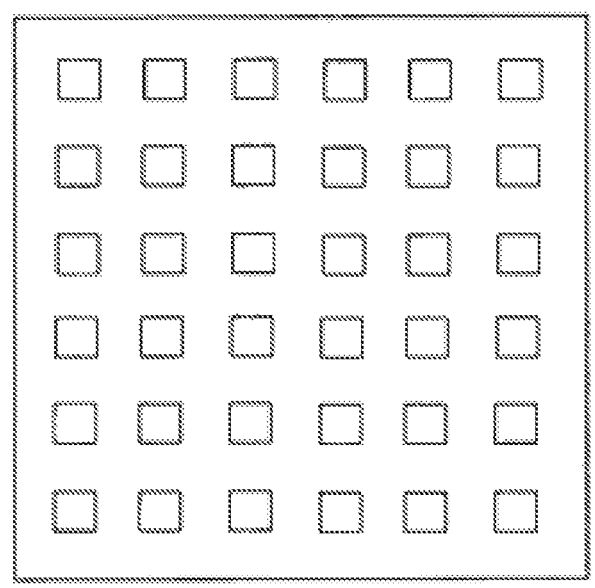
FIG. 34 is a plan view of the conductive bonding material provided with the bumps and depressions in FIG. 33.

FIG. 34 is a plan view of the conductive bonding material provided with the bumps and depressions in FIG. 33.

In FIG. 34, multiple concave portions are formed at regular intervals on the surface of the conductive bonding material.

In addition, the contacts may be controlled to be sufficiently heated at a required fusion bonding temperature by dividing the process into a step of generating high Joule heat by maintaining a small contact pressure (contact force) of the moving electrode for a predetermined time and a step of bringing the moving electrode into close contact with the stationary electrodes by increasing the contact pressure.

Further, in order to minimize temperature rise of the stationary electrode side terminals and shorten the operating time in fusion bonding, the moving electrode should be sufficiently preheated by the heating element at a high temperature for a predetermined time before contacting the stationary electrodes.

Therefore, it is necessary to control feed of the moving electrode by the feed force generation means to control the contact pressure of the moving electrode and preheat the moving electrode.

Here, the feed force generation means may control the contact pressure by the (bidirectional) feed force and the feed position of the moving electrode by coupling the moving electrode to the shaft of a motor configured by a feed screw 851 (a conversion device for converting rotational motion of the motor into rectilinear motion) as in the embodiment of FIG. 25, converting rotational motion of the motor into rectilinear motion, and controlling the rotational torque of the motor.

Here, the motor may be replaced by a stepper motor to bidirectionally feed the moving electrode and detect the feed position of the moving electrode.

That is, since the stepper motor rotates by one step angle per pulse, it is possible to detect the position of the moving electrode by the number of drive pulses of the stepper motor without additionally providing a feed position detection means.

In the case where the heat generation element is provided only in the moving electrode, the thermal resistance of the fusion-bonded contacts should be high in fusion disconnection in order to concentrate the heat transferred from the moving electrode on the contacts and shorten the heating time and to reduce heat transferred to the stationary electrode side terminals and minimize the temperature rise of the stationary electrode side terminals.

Since the conductive bonding material has higher thermal resistance than that of the stationary electrodes (for example, copper), the conductive bonding material is preferably formed to be thick in order to increase the thermal resistance of the contacts. However, it is difficult to control the amount of the conductive bonding material in fusion bonding due to the contact pressure of the moving electrode. In order to solve this issue, bumps and depressions may be formed on the electrode surface of the contacts. In this case, the amount of the conductive bonding material corresponding to a space of the bumps and depressions may be maintained even at the contact pressure, and accordingly thermal resistance may be increased.

Figure 35:
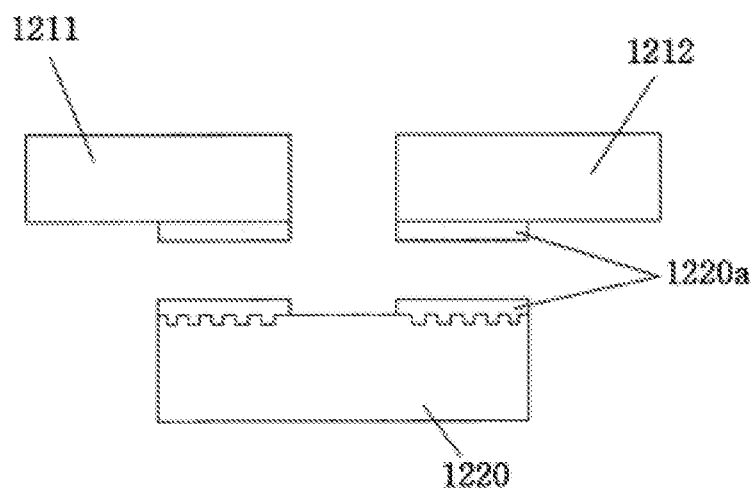
FIG. 35 shows an example in which bumps and depressions are formed on the electrode surface.

FIG. 35 shows an example in which bumps and depressions are formed on the electrode surface.

In FIG. 35, a fusible switch having a moving electrode 1220 and two stationary electrodes 1211 and 1212 which are fusion-bonded through a conductive bonding material 1220*a*, and bumps and depressions are formed on a portion of the surface of the moving electrode 1220 that is fusion-bonded through the conductive bonding material.

While the heating element of the fusible switches of the above embodiments is buried in the moving electrode, the heating element may be attached to the outer surface and inside of the moving electrode except the contact surface of the moving electrode.

Figure 36:
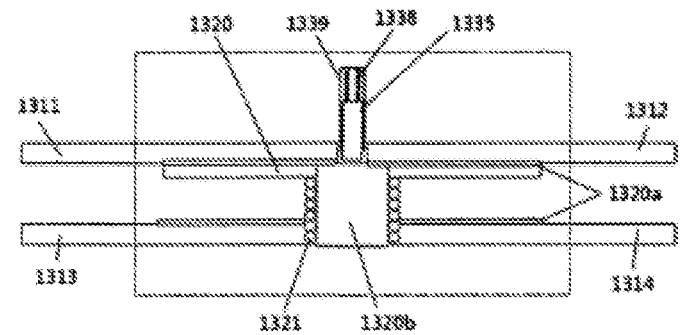
FIG. 36 illustrates an embodiment in which a heating element is attached to the outer surface of the moving electrode in a c-contact fusible switch.
Figure 36:
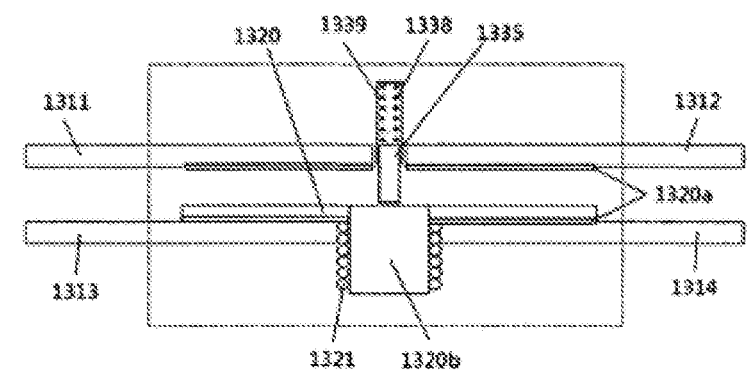
Figure 36:
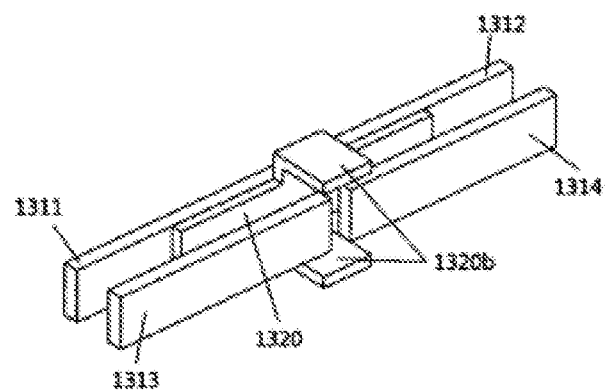

FIG. 36 illustrates an embodiment in which a heating element is attached to the outer surface of the moving electrode in a c-contact fusible switch.

FIG. 36(*a*) shows a moving electrode 1320 in contact with two upper stationary electrodes 1313 and 1314, FIG. 36(*b*) shows the moving electrode 1320 in contact with two lower stationary electrodes 1311 and 1312, and FIG. 36(*c*) is a perspective diagram of an embodiment of FIG. 36(*a*) with the heating element 1321 removed.

As shown in FIG. 36(*a*), the moving electrode 1320 has a branch line on a boundary where the two stationary electrodes 1311 and 1312 are spaced apart from each other, and a heating element 1321 is arranged on the branch line 1320*b*. The branch line may be referred to as a heat transfer branch.

The heating element 1321 composed of an insulated hot wire may be attached to the branch line 1320*b* other than a contact surface of the moving electrode 1320 which contacts two stationary electrodes, as shown in FIG. 36.

When the heating element is arranged on the branch line of the moving electrode, the heat transfer path to the contact surface becomes laterally symmetrical, thereby ensuring equivalent heat transfer to the stationary electrodes and minimizing temperature rise of the stationary electrode side terminals.

The branch line of the moving electrode may be implemented in various shapes according to the required size of the heating element and the shape of the housing of the fusible switch.

Figure 37:
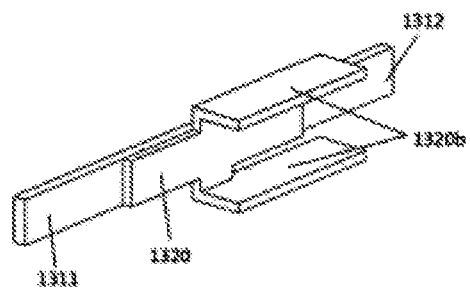
FIG. 37 illustrates an embodiment in which the shape of the branch line of FIG. 36 is changed to increase the surface area of the branch line.
Figure 37:
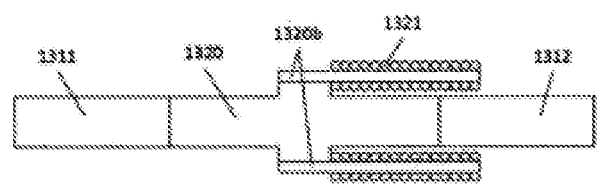
Figure 37:
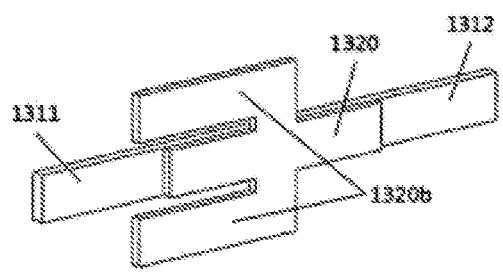
Figure 37:
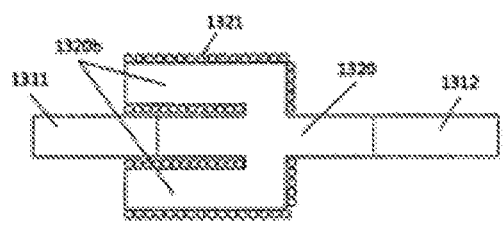

FIG. 37 illustrates an embodiment in which the shape of the branch line of FIG. 36 is changed to increase the surface area of the branch line.

FIG. 37(*a*) is a perspective diagram of an embodiment of the moving electrode 1320 having the branch line 1320*b*.

FIG. 37(*b*) is a plan view showing that the insulated hot wire of the heating element 1321 is attached to the branch line 1320*b* of the moving electrode 1320 in the feed direction of the moving electrode.

FIG. 37(*c*) is a perspective diagram of another embodiment of the moving electrode having the branch line.

FIG. 37(*d*) is a plan view showing that the insulated hot wire of the heating element is attached to the branch line of the moving electrode in a direction perpendicular to the feed direction of the moving electrode.

The moving electrode including the branch line may be easily formed using a copper sheet/plate having a uniform thickness.

Figure 38:
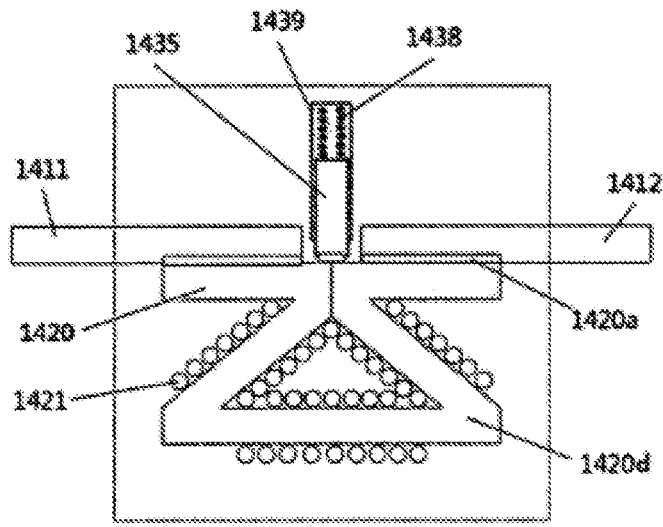
FIG. 38 illustrates another embodiment of the shape of the branch line of the moving electrode for increasing the non-contact surface of the moving electrode to which a hot wire of a heating element is attached.
Figure 38:
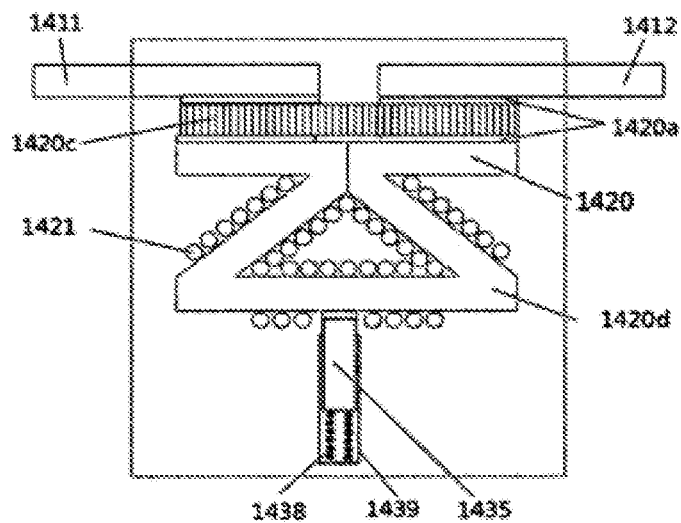

FIG. 38 illustrates another embodiment of the shape of the branch line of the moving electrode for increasing the non-contact surface of the moving electrode to which a hot wire of a heating element is attached.

When the required length of the hot wire according to the amount of generated heat is long or the volume of the heating element is large, the corresponding non-contact surface of the moving electrode should also be sufficiently large.

As shown in FIG. 38, at the boundary where two stationary electrodes 1411 and 1412 are separated, the moving electrode 1420 has a shape of a (triangular) closed loop 1420d including a straight path straightly crossing the spacing gap and a bypass path that bypasses the spacing gap.

FIG. 38(a) shows an embodiment of a b-contact fusible switch in which the moving electrode 1420 has the triangular closed loop 1420d.

FIG. 38(b) shows an a-contact fusible switch in which the moving electrode 1420 has the triangular closed loop 1420d, wherein the moving electrode 1420 and the stationary electrodes 1411 and 1412 are insulated by an insulative support member 1420c. Here, the a-contact fusible switch may be constructed using the fuse wire 350 as in the embodiment of FIG. 9 instead of the insulative support member 1420c.

The closed loop shape may function to sufficiently provide the non-contact surface while minimizing the electrical resistance of the moving electrode.

The closed loop may have various shapes such as a triangle, a circle, and a quadrangle.

If the heating element is installed on the closed loop, the heat transfer path to the contacts becomes laterally symmetrical, thereby ensuring equivalent heat transfer to the contacts of the stationary electrodes and minimizing temperature rise of the stationary electrode side terminals.

The moving electrode having a closed loop shape can be easily fabricated using a copper bar having a uniform thickness.

The straight path of the closed loop may be achieved by welding (arc, plasma laser, electrical resistance, etc.) or bolt/nut fastening of the joint surface of the copper bar.

While the stationary electrodes are positioned to face each other in the above embodiment, they may be positioned parallel to each other.

Figure 39:
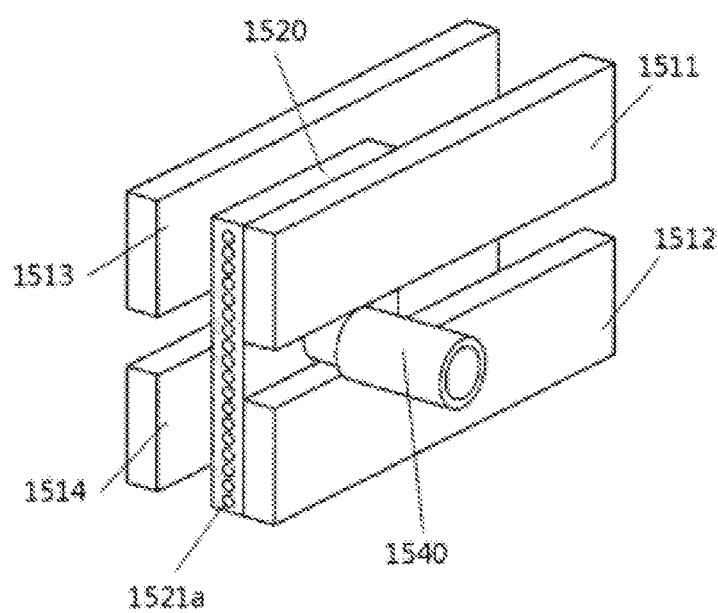
FIG. 39 illustrates an embodiment of a c-contact fusible switch in which an insulated hot wire of a heating element is buried in the moving electrode provided with a plurality of holes and the stationary electrode is arranged in parallel.

FIG. 39 illustrates an embodiment of a c-contact fusible switch in which an insulated hot wire of a heating element is buried in a moving electrode 1520 in which a plurality of holes 1521a is formed, and stationary electrodes 1511, 1512, 1513 and 1514 are positioned parallel to each other.

Figure 40:
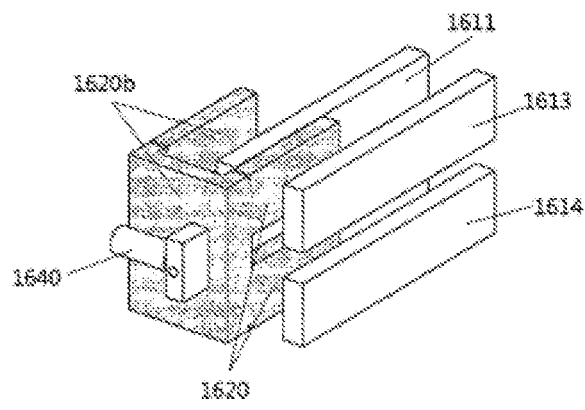
FIG. 40 illustrates an embodiment in which a moving electrode 1620 has a branch line 1620b and an insulated hot wire 1621 of a heating element is positioned on the branch line 1620b.
Figure 40:
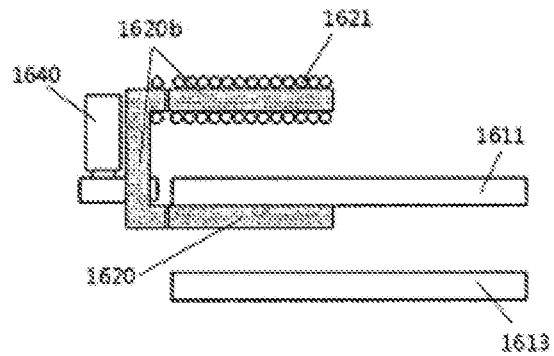
Figure 40:
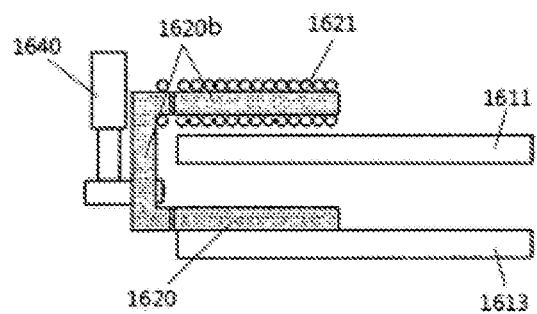

FIG. 40 illustrates an embodiment in which a moving electrode 1620 has a branch line 1620b and an insulated hot wire 1621 of a heating element is positioned on the branch line 1620b.

FIG. 40(a) is a perspective view of an embodiment, FIG. 40(b) is a cross-sectional view illustrating a case when the moving electrode 1620 contacts a stationary electrode 1611, and FIG. 40(c) is a cross-sectional view illustrating a case when the moving electrode 1620 contacts a stationary electrode 1613.

It is apparent that the feed force generation means 1640 may be arranged at various positions according to the shape of the housing of the fusible switch.

Therefore, the fusible switch of the present invention is operated when the feed force generation means is configured such that the contacts of the moving electrode and the two stationary electrodes can be brought into contact with and separated from each other regardless of the shape and position of the stationary electrodes and the moving electrode.

While the heating element is attached only to the surface of the branch line (including the closed loop) of the moving electrode in the embodiment of the branch line (including the closed loop) of the present invention, it may also be buried inside the branch line to maximize heating efficiency.

Figure 41:
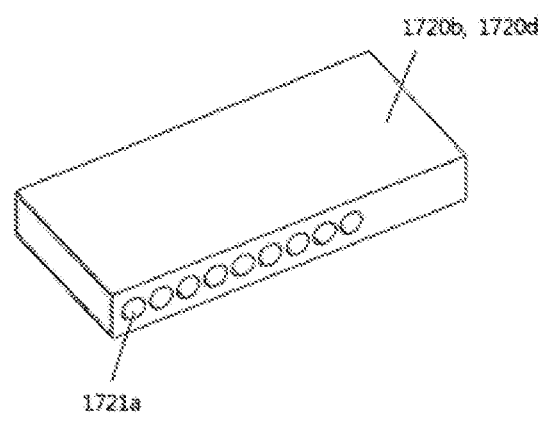
FIG. 41 illustrates an embodiment in which hot wires are simultaneously mounted on the surface and inside of a conductor.
Figure 41:
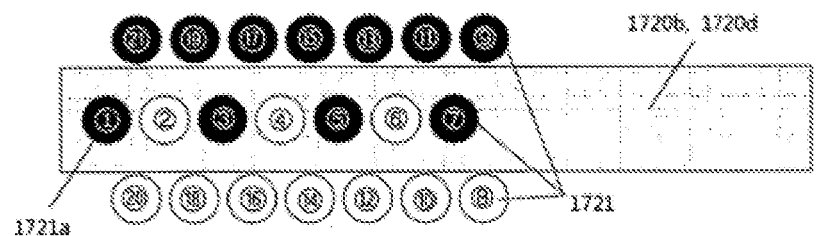

FIG. 41 illustrates an embodiment in which hot wires are simultaneously mounted on the surface and inside of a conductor.

In FIG. 41(a), a plurality of holes 1721a in which a hot wire 1721 of a heating element can be buried is formed in a conductor of the branch lines 1720b and 1720d. When the hot wire is inserted into the holes 1721a in an alternating manner in order of assigned numbers as shown in FIG. 41(b) (where black and white indicate the opposite directions of insertion. For example, black indicates the entering direction and white indicates the exiting direction), the hot wire 1721 may be uniformly arranged on the surface and inside of the conductor of the branch line.

Accordingly, the surface area of the hot wire contacting the conductor per unit area may be increased and thus heating efficiency may be maximized.

For the fusible switch of the present invention, when a heating element is positioned in the moving electrode, the branch line of the moving electrode, and the closed loop, the heat transfer path is symmetrically arranged on the contacts of the two stationary electrodes, and therefore uniform heat transfer to the respective contacts may be achieved.

In addition, since the heat transfer path is formed along the heating element, the moving electrode, the contacts point of the stationary electrodes, and the electrode side terminals of the stationary electrodes in this order, temperature rise of the electrode side terminals of the stationary electrodes may be minimized compared to temperature rise of the contacts.

In the present invention, in order to minimize temperature rise of the stationary electrode side terminals during fusion bonding, the moving electrode may be preheated to a sufficiently high temperature by the heating element before contacting the stationary electrodes.

The fusible switch of the present invention may not only be used for a battery control apparatus or an energy storage system (ESS) of an electric vehicle, but may also be applied to various fields including a large power switch. That is, the fusible switch of the present invention may be applied to any field where an apparatus including a switch for controlling a large current is needed.

The invention claimed is:

1. A fusible switch comprising:
    two stationary electrodes separated from each other;
    a moving electrode capable of moving to contact or be separated from the stationary electrodes;
    a conductive bonding material positioned between the two stationary electrodes and the moving electrode; and
    a heating element,
    wherein a melting point of the conductive bonding material is lower than a melting point of the stationary electrodes and a melting point of the moving electrode,
    wherein the two stationary electrodes are electrically connected when the moving electrode contacts the two stationary electrodes, and are electrically disconnected when the moving electrode is separated from the two stationary electrodes,
    wherein the moving electrode is fusion-bonded to the two stationary electrodes by the conductive bonding material when the moving electrode contacts the two stationary electrodes, and the conductive bonding material is melted when the conductive bonding material is heated through the heating element.

2. A fusible switch comprising:
two stationary electrodes separated from each other;
a moving electrode capable of moving to contact the two stationary electrodes;
a conductive bonding material positioned between the two stationary electrodes and the moving electrode; and
a heating element,
wherein a melting point of the conductive bonding material is lower than a melting point of the stationary electrodes and a melting point of the moving electrode,
wherein the conductive bonding material is fusible by heating of the heating element, and when the conductive bonding material positioned between the moving electrode and the two stationary electrodes is melted by heat of the heating element and then solidified, the moving electrode is fusion-bonded to the two stationary electrodes and the two stationary electrodes are electrically connected.

3. A fusible switch comprising:
two stationary electrodes separated from each other;
a moving electrode capable of moving to be separated from the two stationary electrodes;
a conductive bonding material positioned between the two stationary electrodes and the moving electrode and fusion-bonding the two stationary electrodes with the moving electrode; and
a heating element,
wherein a melting point of the conductive bonding material is lower than a melting point of the stationary electrodes and a melting point of the moving electrode,
wherein the conductive bonding material is fusible by heating of the heating element, and when the moving electrode is moved so as to be separated from the two stationary electrodes after the conductive bonding material positioned between the moving electrode and the two stationary electrodes is melted by heat of the heating element, the two stationary electrodes are electrically disconnected.

4. A fusible switch comprising:
a first stationary electrode and a second stationary electrode separated from each other;
a third stationary electrode and a fourth stationary electrode separated from each other;
one moving electrode;
a conductive bonding material positioned between the stationary electrodes and the moving electrode; and
a heating element,
wherein a melting point of the conductive bonding material is lower than a melting point of the stationary electrodes and a melting point of the moving electrode,
wherein, when the moving electrode contacts the first stationary electrode and the second stationary electrode, the first stationary electrode and the second stationary electrode are electrically connected, and the third stationary electrode and the fourth stationary electrode are electrically disconnected,
wherein, when the moving electrode contacts the third stationary electrode and the fourth stationary electrode, the first stationary electrode and the second stationary electrode are electrically disconnected, and the third stationary electrode and the fourth stationary electrode are electrically connected, wherein, when the moving electrode contacts two of the stationary electrodes, the moving electrode is fusion-bonded to the two stationary electrodes by the conductive bonding material,
wherein, when the moving electrode is separated from the two stationary electrodes, the moving electrode is fusion-disconnected from the two stationary electrodes by the conductive bonding material,
wherein the conductive bonding material is melted when the conductive bonding material is heated through the heating element.

5. A fusible switch comprising:
two stationary electrodes separated from each other;
a moving electrode capable of moving to contact the two stationary electrodes;
a conductive bonding material positioned between the two stationary electrodes and the moving electrode,
wherein a melting point of the conductive bonding material is lower than a melting point of the stationary electrodes and a melting point of the moving electrode,
wherein the two stationary electrodes are electrically connected when the moving electrode contacts the two stationary electrodes, and are electrically disconnected when the moving electrode is separated from the two stationary electrodes,
wherein, when the moving electrode moves to contact the two stationary electrodes and comes into contact with the two stationary electrodes while an open voltage allowing an on-current to be applied to both ends of the two stationary electrodes is applied, the on-current flows between the two stationary electrodes via the moving electrode and the conductive bonding material, the conductive bonding material is melted by Joule heat of the on-current and is then solidified when on resistance between the two stationary electrodes is lowered.

6. The fusible switch according to claim 1, wherein the heating element is formed inside the moving electrode to maximize heating efficiency, at least one hole is formed in the moving electrode, and the heating element in an insulated state is inserted into the hole.

7. The fusible switch according claim 1, wherein the heating element is attached to a portion of a surface of the moving electrode other than a contact surface of the moving electrode brought into contact with the two stationary electrodes.

8. The fusible switch according to claim 1, wherein the moving electrode has one or more branch lines, and the heating element is provided on the branch lines.

9. The fusible switch according to claim 8, wherein the branch lines are branched from the moving electrode at a position where heat transfer to contact portions of the moving electrode and the two stationary electrodes becomes symmetrical.

10. The fusible switch according to claim 8, wherein the number of the branch lines is greater than or equal to 2, and ends of the branch lines are connected to form a closed loop.

11. The fusible switch according to claim 8, wherein the heating element is provided on a surface and inside of the branch lines.

12. The fusible switch according to claim 1, wherein the heating element is positioned such that a heat transfer path is formed along the heating element, the moving electrode, contacts of the stationary electrodes, and electrode side terminals of the stationary electrodes.

13. The fusible switch according to claim 1, further comprising:

a feed force generation means for generating force capable of shifting a position of the moving electrode.

14. The fusible switch according to claim 13, wherein the feed force generation means is capable of controlling a contact pressure generated when the moving electrode contacts the two stationary electrodes.

15. The fusible switch according to claim 1, wherein bumps and depressions are formed on a surface of the surfaces of the moving electrode and the stationary electrodes, the surface being fusion-bonded through the conductive bonding material.

16. The fusible switch according to claim 1, wherein a part or entirety of a surface of the conductive bonding material has bumps and depressions.

17. The fusible switch according to claim 1, wherein power to the heating element is supplied or cut off by a power supply positioned outside the heating element.

18. The fusible switch according to claim 13, wherein the feed force generation means is connected to the moving electrode via a transfer link, wherein the transfer link is formed of a flat plate-shaped partition insulator moving across a gap between the two stationary electrodes to prevent shorting between the two stationary electrodes.

19. The fusible switch according to claim 13, further comprising:
a feed restraining means for supporting the moving electrode so as not to move in a specific direction.

20. The fusible switch according to claim 13, further comprising:
a support member for supporting the moving electrode so as not to move in a specific direction,
wherein the support member melts at a temperature lower than the melting points of the two stationary electrodes and the moving electrode.

21. The fusible switch according to claim 13, wherein the feed force generation means is constrained by a fuse wire to interrupt the feed force applied to the moving electrode,
wherein, when the fuse wire is melted and cut by supply of current, the feed force of the feed force generation means is applied to the moving electrode.

22. The fusible switch according to claim 1, wherein the stationary electrodes or the moving electrode bonded through the conductive bonding material is provided with a groove along a rim of the contacts.

23. The fusible switch according to claim 1, wherein a concave portion is formed in an electrode positioned on a lower side (an electrode positioned in a direction of action of gravity) among the stationary electrodes and the moving electrode bonded through the conductive bonding material, and the conductive bonding material is positioned in the concave portion.

24. The fusible switch according to claim 1, wherein a semiconductor switch is connected in parallel to both ends of the two stationary electrodes to provide a path of the on-current during fusion disconnection or fusion bonding to suppress arc generation at both the ends of the stationary electrodes.

25. The fusible switch according to claim 24, further comprising:
a current detection means for measuring a current flowing through the fusible switch to minimize an on time of the semiconductor switch.

26. A fusible switch comprising:
a first stationary electrode;
a second stationary electrode;
a moving electrode;
a conductive bonding material positioned between the first and second stationary electrodes and the moving electrode;
a heating element;
a feed force generation means for generating a force for moving the moving electrode to the first stationary electrode; and
a feed restraining means for preventing the moving electrode from moving to the first stationary electrode,
wherein the moving electrode is electrically connected to the second stationary electrode before heating of the heating element, and after the heating of the heating element, the conductive bonding material melts and the feed restraining means allows movement of the moving electrode such that the moving electrode is fusion-bonded and electrically connected to the first stationary electrode through the conductive bonding material.

27. The fusible switch according claim 1, wherein a portion of the stationary electrodes which contacts the moving electrode is formed to be thinner than a portion of the stationary electrodes which does not contact the moving electrode.

28. A battery control apparatus comprising the fusible switch according to claim 1.

29. The fusible switch according to claim 1, wherein the moving electrode is moved after power is supplied to the heating element for a predetermined time in order to preheat the moving electrode before the fusible switch performs fusion bonding.

* * * * *